US011445138B2

United States Patent
Tomita et al.

(10) Patent No.: US 11,445,138 B2
(45) Date of Patent: Sep. 13, 2022

(54) SOLID-STATE IMAGING DEVICE

(71) Applicant: Sony Semiconductor Solutions Corporation, Kanagawa (JP)

(72) Inventors: Kazutoshi Tomita, Kanagawa (JP); Shinichirou Etou, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/262,083

(22) PCT Filed: Aug. 26, 2019

(86) PCT No.: PCT/JP2019/033396
§ 371 (c)(1),
(2) Date: Jan. 21, 2021

(87) PCT Pub. No.: WO2020/045373
PCT Pub. Date: Mar. 5, 2020

(65) Prior Publication Data
US 2021/0306587 A1 Sep. 30, 2021

(30) Foreign Application Priority Data

Aug. 30, 2018 (JP) .............................. JP2018-161788
Nov. 8, 2018 (JP) .............................. JP2018-210684

(51) Int. Cl.
*H04N 5/3745* (2011.01)
*H04N 5/369* (2011.01)

(52) U.S. Cl.
CPC ....... *H04N 5/37455* (2013.01); *H04N 5/3698* (2013.01)

(58) Field of Classification Search
CPC ............. H04N 5/37455; H04N 5/3698; H04N 5/3658; H04N 5/378; H03M 1/08; H03M 1/46; H03M 1/56; H03M 1/74
(Continued)

(56) References Cited

U.S. PATENT DOCUMENTS

2012/0127356 A1 * 5/2012 Matsuura ............. H04N 5/3577
348/E3.016
2016/0006969 A1 1/2016 Matsumoto
(Continued)

FOREIGN PATENT DOCUMENTS

JP 2008-60872 A 3/2008
JP 2011-50046 A 3/2011
(Continued)

OTHER PUBLICATIONS

International Search Report (PCT/ISA/210), International Application No. PCT/JP2019/033396, dated Oct. 29, 2019.
(Continued)

*Primary Examiner* — Lin Ye
*Assistant Examiner* — Chan T Nguyen
(74) *Attorney, Agent, or Firm* — Michael Best & Friedrich LLP

(57) ABSTRACT

A solid-state imaging device configured to suppress fixed pattern noise having column correlation and/or lateral correlation from being generated in images is disclosed. In one example, a solid-state imaging device includes unit pixels arranged in row and column directions, vertical signal lines respectively connected to at least one of the unit pixels arranged in the column direction, first converters connected to the respective vertical signal lines and configured to convert an analog pixel signal into a digital pixel signal in reading each unit pixel arranged in the row direction, an initialization voltage generator that outputs an initialization voltage for initializing the unit pixels or input nodes of the first converters, and an initialization voltage line that connects the initialization voltage generator and the first converters. The initialization voltage generator changes the initialization voltage that is output for each row and/or column to be processed by the first converters.

9 Claims, 16 Drawing Sheets

(58) Field of Classification Search
USPC .................................. 348/308; 341/155–172
See application file for complete search history.

(56) References Cited

U.S. PATENT DOCUMENTS

2016/0286144 A1* 9/2016 Yanai ................. H04N 5/37455
2018/0115726 A1  4/2018 Yoshimura
2018/0309458 A1* 10/2018 Bandyopadhyay ... H03M 1/804

FOREIGN PATENT DOCUMENTS

WO  2014/132822 A1  9/2014
WO  2016/167290 A1  10/2016
WO  2017/119166 A1  7/2017

OTHER PUBLICATIONS

Notification of Transmittal of the International Search Report and the Written Opinion of the International Searching Authority, or the Declaration (PCT/ISA/220), International Application No. PCT/JP2019/033396, dated Nov. 12, 2019.

* cited by examiner (N-th ROW and N-th COLUMN)

(N+1-th ROW and N-th COLUMN)

(N-th ROW and N+1-th COLUMN)

SOLID-STATE IMAGING DEVICE

FIELD

The present disclosure relates to a solid-state imaging device.

BACKGROUND

In recent years, a complementary metal-oxide semiconductor (CMOS)-type solid-state imaging device (hereinafter, also referred to as a CMOS image sensor or a CMOS solid-state imaging device) has been attracted attention as an image sensor that replaces a charge coupled device (CCD)-type solid-state imaging device.

In the CMOS image sensor, it is possible to adopt what is called a column parallel-type or column-type reading method in which one or more rows in a pixel array are selected for reading pixel signals and are simultaneously accessed to read the pixel signals from the pixel array in units of rows, that is, simultaneously in parallel for one or more rows of pixels.

Furthermore, the solid-state imaging device such as the CMOS image sensor may adopt a method in which analog pixel signals read from a pixel array are converted into digital data by an analog-to-digital converter (hereinafter, also referred to as an ADC converter (analog digital converter)) and then output to an exterior.

The same applies to a column-parallel image sensor and various signal output circuits thereof have been devised. However, as an example of the most advanced form, there has been proposed a method in which an AD converter is provided for each column and pixel signals are taken out to an exterior as digital data.

CITATION LIST

Patent Literature

Patent Literature 1: Japanese Patent Application Laid-open No. 2011-50046
Patent Literature 2: Japanese Patent Application Laid-open No. 2008-60872
Patent Literature 3: International Publication No. WO2014/132822

Non-Patent Literature

Non-Patent Literature 1: Kazuya Yonemoto, "From Basics, Applications-Principles, Structures, Operation Methods, and Various Characteristics of CCD/CMOS Image Sensor to System Overview", C&E Basic Commentary Series, CQ Publishing Co., Ltd., p 202.

SUMMARY

Technical Problem

However, in a configuration such as a column parallel type in which the same processing circuit performs signal processing on image signals read from unit pixels in the same column, variation and noise are likely to occur with column correlation. Therefore, when variation and noise are not sufficiently suppressed, there is a problem in that vertical stripe-shaped fixed pattern noise (hereinafter, also referred to as FPN) with column correlation is likely to occur in an image.

In this regard, the present disclosure suggests a solid-state imaging device capable of suppressing fixed pattern noise from being generated in an image.

Solution to Problem

To solve the above-described problem, a solid-state imaging device according to one aspect of the present disclosure comprises: a plurality of unit pixels arranged in a row direction and a column direction; a plurality of vertical signal lines each connected to at least one of the unit pixels arranged in the column direction; a plurality of first converters connected to the respective vertical signal lines and converting an analog pixel signal appearing on the corresponding vertical signal line into a digital pixel signal in reading each unit pixel arranged in the row direction; an initialization voltage generator that outputs an initialization voltage for initializing the unit pixels or input nodes of the first converters; and an initialization voltage line that connects the initialization voltage generator and the first converters, wherein the initialization voltage generator changes the initialization voltage that is output for each row and/or column to be processed by the first converters.

(Operation) In accordance with the solid-state imaging device of an aspect according to the present disclosure, when a bias current (reading current for a unit pixel) of a vertical signal line is randomly changed for each row and/or column or an initialization voltage and a control pulse width of a switch that applies the initialization voltage are randomly changed for each row and/or column, noise signals having noise levels different in two-dimensional space are superimposed on a pixel signal read from the unit pixel and appearing on the vertical signal line, so that it is possible to generate different quantization errors, different AD conversion results, and different initialization potentials in two dimensional space. As a consequence, it is possible to reduce the generation of vertical stripe-shaped fixed pattern noise with column correlation and noise in a row direction (lateral direction) such as streaking.

ADVANTAGEOUS EFFECTS OF DISCLOSURE

According to the present disclosure, it is possible to suppress fixed pattern noise from being generated in an image. Note that the effects described herein are not necessarily limited and may be any of the effects described in the present disclosure.

DESCRIPTION OF EMBODIMENTS

Figure 1:
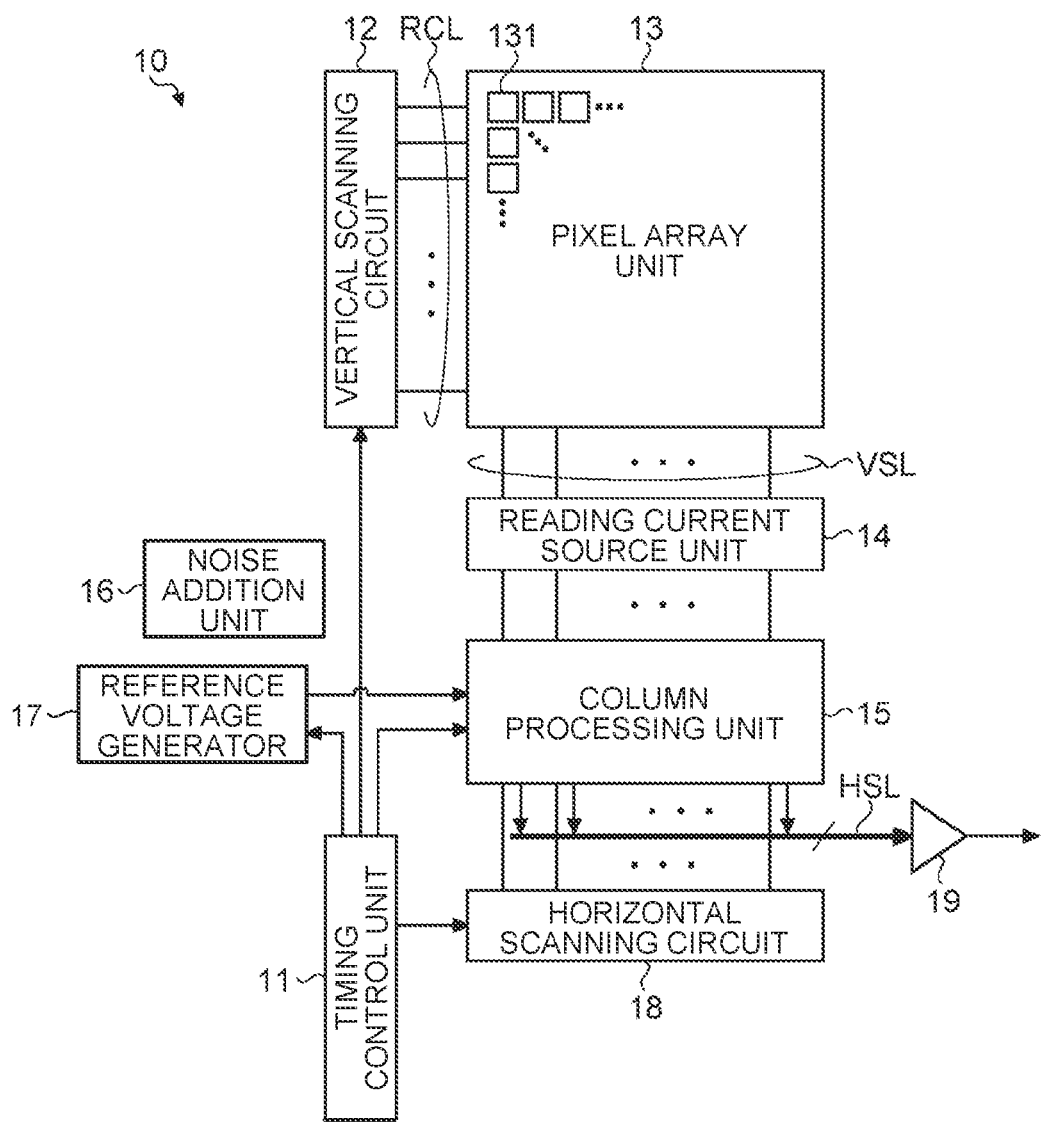
FIG. 1 is a schematic configuration diagram of a CMOS solid-state imaging device according to a first embodiment.

Hereinafter, embodiments of the present disclosure will be described in detail with reference to the drawings. Note that in the following embodiments, the same parts are denoted by the same reference signs and a description thereof will be omitted in order to avoid redundancy.

Furthermore, the present disclosure will be described according to the order of the following items.

1. Introduction
2. First Embodiment
2.1 Overall overview of solid-state imaging device
2.2 Unit pixel
2.3 Pixel array unit and column processing unit
2.4 Operation of solid-state imaging device
2.5 Problems of column AD conversion
2.6 Fixed pattern noise reduction method
   2.6.1 First method
      2.6.1.1 Example of initialization voltage generator
         2.6.1.1.1 First example
         2.6.1.1.2 Second example
   2.6.2 Second method
   2.6.3 Third method
2.7 Operation and effect
3. Second Embodiment
4. Third Embodiment
4.1 Addition circuit of offset
4.2 Operation and effect
5. Fourth Embodiment
5.1 Modification of capacitive DAC
   5.1.1 First modification
   5.1.2 Second modification
6. Fifth Embodiment
7. Sixth Embodiment
8. Application to indirect TOF-type distance image sensor
8.1 System configuration example
8.2 Circuit configuration example of pixel 1. Introduction Hereinafter, embodiments of the prevent disclosure will be described in detail with reference to the drawings. Note that in the following, a case where a CMOS solid-state imaging device, which is an example of an X-Y address-type solid-state imaging device, is used as a device, will be described as an example. Furthermore, the CMOS solid-state imaging device will be described on the assumption that all pixels are made of NMOS.

However, this is an example and a target device is not limited to a MOS-type solid-state imaging device. All embodiments to be described below can be applied in the same manner to all semiconductor devices for detecting a physical quantity distribution in which a plurality of unit components sensitive to electromagnetic waves input from an exterior such as light and radiation are arranged in a line shape or a matrix shape.

2. First Embodiment

First, a first embodiment of the prevent disclosure will be described in detail with reference to the drawings.

2.1 Overall Overview of Solid-State Imaging Device

FIG. 1 is a schematic configuration diagram of a CMOS solid-state imaging device (hereinafter, simply referred to as a solid-state imaging element) according to the first embodiment.

A solid-state imaging device 10 has a pixel array unit in which a plurality of unit pixels including a light receiving element (example of a charge generation unit) for outputting signals according to the amount of incident light are arranged in rows and columns (that is, in a two-dimensional matrix shape), a signal output from each unit pixel is a voltage signal, and a correlated double sampling (CDS) processing function unit, a digital conversion unit (analog digital converter (ADC)), and the like are provided in parallel in columns.

"The CDS processing function unit and the digital conversion unit are provided in parallel in columns" means that a plurality of CDS processing function units and digital conversion units are provided substantially in parallel with vertical signal lines (example of column signal lines) VSL of one or a plurality of vertical columns.

When the device is viewed in a plan view, each of the functional units may be arranged only on one end edge side (output side arranged on a lower side in the drawing) in a column direction with respect to a pixel array unit 13, or may be arranged on the one end edge side (output side arranged on the lower side in the drawing) in the column direction with respect to the pixel array unit 13 and the other end edge side (upper side in the drawing) that is opposite to the one end edge side. In the latter case, it is preferable that horizontal scanning circuits that perform read scanning in a row direction (horizontal scanning) be also arranged on each end edge side and be operable independently.

For example, as a typical example in which the CDS processing function unit and the digital conversion unit are provided in parallel in columns, there is a column type in which the CDS processing function unit and the digital conversion unit are provided for each vertical column or each of a plurality of vertical columns in a part called a column region provided on an output side of an imaging unit, and pixel signals are sequentially read to the output side. In the present description, it is assumed that the column type (column-parallel type) includes a form in which one CDS processing function unit and one digital conversion unit are assigned to a plurality of (for example, four) adjacent vertical signal lines VSL (vertical columns) (corresponding to for "each of a plurality of vertical columns"), a form in which one CDS processing function unit and one digital conversion unit are assigned to a plurality of vertical signal lines VSL (vertical columns) every L lines (L is a positive integer; L-1 lines are arranged between them) (corresponding to "for each of a plurality of vertical columns"), and the like, in addition to a form in which one CDS processing function unit and one digital conversion unit are assigned to one vertical signal line VSL (vertical column) (corresponding to "for each vertical column").

In a case of adopting the form in which one CDS processing function unit and one digital conversion unit are assigned to the vertical signal lines VSL (vertical columns), signal processing is performed for each pixel signal by accessing the vertical signal lines VSL (vertical columns), so that it is possible to achieve an increase in the number of pixels, size reduction, cost reduction, and the like of an image sensor, as compared with a case where the same signal processing is performed for each unit pixel.

Furthermore, since a plurality of pixel signals read from the same row can be simultaneously processed in parallel by a plurality of signal processing units arranged in parallel in columns, the signal processing units can be operated at a low speed as compared with a case where processing is performed by one CDS processing function unit and one digital conversion unit on the output circuit side or outside the device, and it is advantageous in terms of power consumption, band performance, noise, and the like. Conversely, when the power consumption, the band performance, and the like are the same, the entire sensor can operate at a high speed.

As illustrated in FIG. 1, the solid-state imaging device 10 of the present embodiment includes the pixel array unit 13 in which a plurality of unit pixels 131 are arranged in rows and columns, a reading current source unit 14 that supplies an operating current for reading a pixel signal (hereinafter, referred to as a reading current) to the unit pixels 131 of the pixel array unit 13, a column processing unit 15 having column AD circuits arranged for each vertical column, a reference voltage generator 17 that supplies a reference voltage REF for AD conversion (also referred to as sampling) to the column processing unit 15, and an output unit 19.

Furthermore, driving control units are provided outside the pixel array unit 13 to sequentially read signals of the pixel array unit 13. The driving control units may include, for example, a horizontal scanning circuit (column scanning circuit) 18 that controls column addresses and column scanning, a vertical scanning circuit (row scanning circuit) 12 that controls row addresses and row scanning, and a timing control unit 11 having a function of generating an internal clock, for example.

Moreover, the solid-state imaging device 10 according to the present embodiment includes a noise addition unit 16 that adds noise to a pixel signal, as a configuration for reducing fixed pattern noise (FPN).

Each of these functional units is provided on, for example, a single or stacked semiconductor substrate.

Details of the noise addition unit 16 will be described below, but the noise addition unit 16 has a characteristic in that its function is to allow a pixel signal supplied from the pixel array unit 13 to the column processing unit 15 to include noise signals having noise levels different in two-dimensional space by randomly changing a bias current (reading current for the unit pixels 131) of the vertical signal line VSL for each row and/or column, or randomly changing a control pulse width (length along a time axis; the same applies hereinafter) of a switch that applies an initialization voltage INT for initializing an internal node of a comparator in the column processing unit 15, for each row and/or column.

Note that an auto gain control (AGC) circuit having a signal amplification function, and the like, may also be provided in the same semiconductor region as the column processing unit 15, at the preceding stage or subsequent stage of the column processing unit 15 as necessary. When the AGC is performed at the preceding stage of the column processing unit 15, it is analog amplification, and when the AGC is performed at the subsequent stage of the column processing unit 15, it is digital amplification. When n-bit digital data is simply amplified, since gradation may be impaired, it is preferable to amplify analog data and then convert the analog data into digital data.

Furthermore, the solid-state imaging device 10 may also be provided with a clock conversion unit that is an example of a high-speed clock generation unit and generates a pulse having a clock frequency higher than an input clock frequency. The timing control unit 11 generates an internal clock based on an input clock (for example, a master clock) input from an exterior or a high-speed clock generated by the clock conversion unit.

Furthermore, in FIG. 1, for the purpose of simplicity, a part of the rows and columns in the pixel array unit 13 is not illustrated, but actually, several tens to several thousands of unit pixels 131 are arranged in each row and each column. Respective unit pixels 131 are connected to the vertical scanning circuit 12 via row control lines RCL for row selection, and are connected to the column processing unit 15, in which the column AD circuits are provided for each vertical column, via the vertical signal lines VSL. The row control lines RCL refer to the overall wiring that enters pixels from the vertical scanning circuit 12.

Details of the column AD circuit of the column processing unit 15 will be described below, but the column processing unit 15 includes an AD conversion section that independently converts a reset level and a signal level, which are reference levels of a pixel signal, into digital data. Furthermore, the column processing unit 15 may have a function of a difference processing unit (corresponding to a CDS process) that performs a difference process between an AD conversion result of the reset level and an AD conversion result of the signal level and acquires digital data of a signal component indicated by the difference between the reset level and the signal level.

The horizontal scanning circuit 18 has a function of a reading scanning unit that reads the digital data from the column processing unit 15.

The horizontal scanning circuit 18 and the vertical scanning circuit 12 each include, for example, a decoder, and are configured to start a shift operation (scanning) in response to a control signal applied from the timing control unit 11. Therefore, the row control line RCL includes various pulse signals (for example, a pixel reset pulse, a transfer pulse, a connection control pulse with the vertical signal line VSL, and the like) for driving the unit pixels 131.

Although not illustrated in the drawing, the timing control unit 11 includes a functional block of a timing generator (example of a reading address control device) that supplies a clock and a pulse signal of a predetermined timing required for an operation of each part, a functional block of a communication interface that receives a master clock and data for instructing an operation mode and the like from an exterior or outputs data including information of the solid-state imaging device 10, and the like.

For example, the timing control unit 11 outputs a horizontal address signal to a horizontal decoder in the horizontal scanning circuit 18, and outputs a vertical address signal to a vertical decoder in the vertical scanning circuit 12. Each decoder receives the address signal and selects a corresponding row or column.

The timing control unit 11 supplies each part in the solid-state imaging device 10, for example, the horizontal scanning circuit 18, the vertical scanning circuit 12, the column processing unit 15, and the like, with a clock having the same frequency as that of the master clock input from an exterior, a high-speed clock generated internally, ½-frequency divided clocks, a low-speed clock obtained by finer frequency division, and the like. Hereinafter, the ½-frequency divided clocks and clocks having frequencies lower than that will be collectively referred to as low-speed clocks.

The vertical scanning circuit 12 selects the rows of the pixel array unit 13 and supplies a necessary pulse to the rows. For example, the vertical scanning circuit 12 has a vertical decoder that defines vertical reading rows (selects the rows of the pixel array unit 13), and a vertical driving unit that supplies and drives a pulse to the row control lines RCL for the unit pixel 131 on the reading address (row direction) defined by the vertical decoder. Note that the vertical decoder selects a row for an electronic shutter, and the like in addition to a row for reading a signal.

The horizontal scanning circuit 18 sequentially selects the column AD circuits of the column processing unit 15 in synchronization with the low-speed clock, and guides the signal to a horizontal signal line (horizontal output line) HSL. For example, the horizontal scanning circuit 18 has a horizontal decoder that defines horizontal reading columns (selects individual column AD circuits in the column processing unit 15), and a horizontal driving unit that guides each signal of the column processing unit 15 to the horizontal signal line HSL according to the reading addresses defined by the horizontal decoder.

In the solid-state imaging device 10 having such a configuration, pixel signals output from the unit pixels 131 are supplied to the column AD circuits of the column processing unit 15 via the vertical signal lines VSL for each vertical column.

Each column AD circuit of the column processing unit 15 receives analog signals of one column of pixels and processes the analog signals of the pixels. For example, each column AD circuit has an analog digital converter (ADC) circuit that converts the analog signal into, for example, a 10-bit digital signal by using, for example, the low-speed clock.

The AD conversion process in the column processing unit 15 adopts a method of AD-converting analog pixel signals, into digital signals, that are read in parallel in units of rows, in parallel for each one or a plurality of rows by using the column AD circuits provided for each one or a plurality of columns. In such a case, in the present embodiment, a method of a successive approximation register (SAR)-type AD conversion method is used.

In the successive approximation register-type AD conversion, bit values are specified in order from the most significant bit (MSB) to the least significant bit (LSB) based on a reference voltage for successive approximation (hereinafter, referred to as a SAR reference voltage) output from a capacitive digital to analog converter (DAC). As a mechanism for this, in principle, an operation in which the SAR reference voltage is input from the capacitive DAC to a comparator (voltage comparator) and the capacitive DAC generates a SAR reference voltage for the next bit based on a comparison result by the comparator and applies the generated SAR reference voltage to the comparator, is repeatedly performed from the most significant bit (MSB) to the least significant bit (LSB). With this, the analog pixel signal is converted into a digital pixel signal.

Furthermore, what is called a CDS process is performed to take a difference between a signal level (a noise level or a reset level) immediately after pixel reset and a true signal level according to the amount of received light, with respect to a pixel signal in a voltage mode that is input via the vertical signal line VSL. With this, it is possible to reduce or remove a noise signal component called fixed pattern noise and reset noise.

2.2 Unit Pixel

In the present embodiment, as the unit pixel 131 used in the solid-state imaging device 10, it is possible to use a unit pixel having a 4TR (transistor) configuration generally used as a CMOS sensor, or a unit pixel having a 3TR configuration composed of three transistors, which are disclosed in Japanese Patent Application Laid-open No. 2008-60872, for example. Of course, these pixel configurations are examples, and any pixel configuration can also be used as long as it has an ordinary CMOS image sensor array configuration.

Typically, the unit pixel 131 includes a photodiode as a light receiving element (charge generation unit) and an in-pixel amplifier having a semiconductor element for amplification (for example, a transistor).

As the in-pixel amplifier, for example, an amplifier having a floating diffusion amplifier configuration is used. As an example, for the charge generation unit, it is possible to use an amplifier with a configuration including four transistors generally used as a CMOS sensor, that is, a read-select transistor as an example of a charge reading unit (transfer gate/read gate), a reset transistor as an example of a reset gate, a vertical selection transistor, and an amplification transistor with a source follow configuration as an example of a detection element for detecting a change in the potential of floating diffusion.

Alternatively, it is possible to use an amplifier with a configuration including three transistors for amplifying a signal voltage corresponding to signal charge generated by the charge generation unit, that is, an amplification transistor connected to a drain line, a reset transistor for resetting the charge generation unit, and a read-select transistor (transfer gate) scanned from a vertical shift register via transfer wiring.

Note that the solid-state imaging device 10 allows the pixel array unit 13 to support color imaging by using a color decomposition (color separation) filter. That is, certain color filters of the color decomposition filter including a combination of color filters of a plurality of colors for capturing a color image are provided in, for example, what is called a Bayer arrangement and the like on a light receiving surface of each charge generation unit (photodiode and the like) in the pixel array unit 13 on which electromagnetic waves (light in the present example) are incident, so that it is possible to support color image imaging.

2.3 Pixel Array Unit and Column Processing Unit

Figure 2:
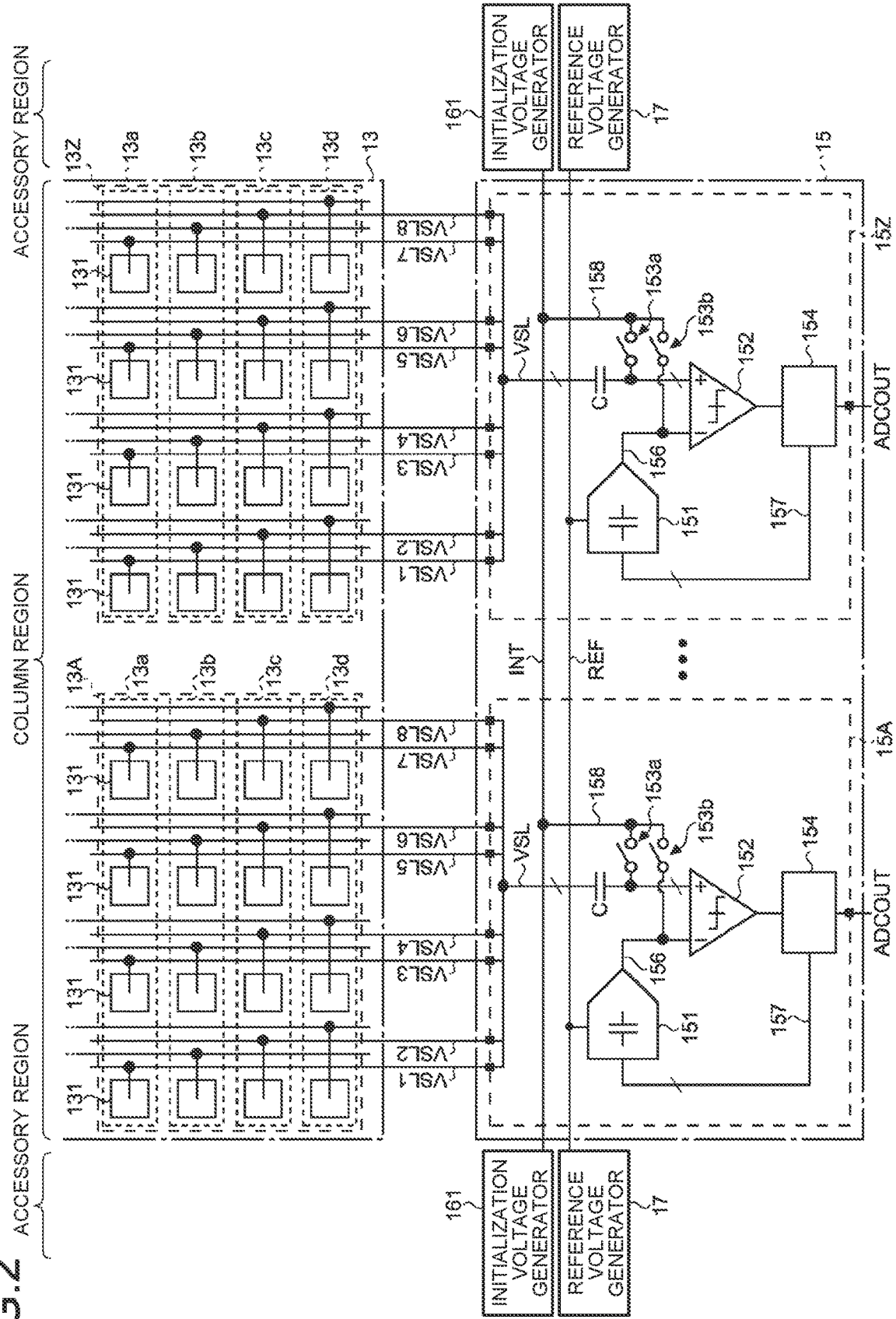
FIG. 2 is a circuit diagram illustrating a configuration example of a pixel array unit and a column processing unit according to the first embodiment.

Subsequently, specific examples of the pixel array unit 13 and the column processing unit 15 in FIG. 1 will be described in detail with reference to the drawings. FIG. 2 is a circuit diagram illustrating a configuration example of the pixel array unit and the column processing unit according to the present embodiment. Note that, in FIG. 2, the reading current source unit 14 is omitted for simplification of description. Furthermore, FIG. 2 illustrates initialization voltage generators 161 as an example of the noise addition unit 16.

As illustrated in FIG. 2, the pixel array unit 13 and the column processing unit 15 are provided in a part called a column region in the solid-state imaging device 10. On the other hand, the initialization voltage generators 161 and the reference voltage generators 17 are provided in an accessory region where peripheral circuits such as the timing control unit 11 are arranged. The initialization voltage generator 161 may be provided at one end of wiring to which an initialization voltage INT is applied (hereinafter, referred to as an initialization voltage line; for simplification of description, the reference sign of the initialization voltage line is designated as INT), or may be provided at both ends of the initialization voltage line INT. Similarly, the reference voltage generator 17 may be provided at one end of wiring to which a reference voltage REF is applied (hereinafter, referred to as a reference voltage line; for simplification of description, the reference sign of the reference voltage line is designated as REF), or may be provided at both ends of the reference voltage line REF. The initialization voltage generator 161 and the reference voltage generator 17 are provided at both ends thereof, respectively, so that it is possible to supply more stable initialization voltage INT and reference voltage REF. Although the area is increased, the initialization voltage generator 161 and the reference voltage generator 17 may be disposed in each column region.

In the present invention, the pixel array unit 13 has a configuration in which the unit pixels 131 arranged in a two-dimensional matrix shape are grouped into a plurality of pixel groups (for example, groups 13A to 13Z and the like). On the other hand, the column processing unit 15 includes the column AD circuits (for example, column AD circuits 15A to 15Z and the like; hereinafter, the column AD circuit is also referred to as a first converter) having a one-to-one relation with the pixel groups 13A to 13Z. That is, the example illustrated in FIG. 2 has a configuration in which one column AD circuit is provided to four adjacent vertical signal lines VSL (vertical columns). However, the correspondence relation between the vertical columns and the column AD circuits 15A to 15Z is not limited thereto, and, for example, as described above, the correspondence relation may be modified in various ways such as a configuration in which one column AD circuit is provided to one vertical signal line VSL (vertical column) or a configuration in which one column AD circuit is provided to the vertical signal lines VSL (vertical column) every L lines.

Each of the pixel groups 13A to 13Z in the pixel array unit 13 is further divided into smaller groups 13a to 13d for each unit pixel 131 arranged in the row direction. For example, in the example illustrated in FIG. 2, each of the pixel groups 13A to 13Z is formed by a total of 16 (4×4) unit pixels 131, and is further divided into the groups 13a to 13d each composed of four unit pixels 131 arranged in the row direction. Among the groups 13a to 13d, the unit pixels 131 belonging to the group 13a and the unit pixels 131 belonging to the group 13c are connected to a common column AD circuit (any one of the column AD circuits 15A to 15Z) via vertical signal lines VSL1 to VSL8, for example. The unit pixels 131 belonging to the remaining groups 13b and 13d are commonly connected to any one of the column AD circuits in a column processing unit (not illustrated) provided on the side opposite to the column processing unit 15 with the pixel array unit 13 interposed therebetween. Note that the column processing unit (not illustrated) may also have the same configuration as that of the column processing unit 15. However, the correspondence relation between the groups 13a to 13d and the column processing unit 15 is not limited thereto, and may be modified in various ways such as a configuration in which all the groups 13a to 13d are connected to the column processing unit 15 provided on the same side as the pixel array unit 13.

The vertical signal lines VSL1 to VSL8 of each of the pixel groups 13A to 13Z (hereinafter, the reference sign of any pixel group is designated as 13X) may be shared by one vertical signal line VSL, or may be connected to a corresponding column AD circuit (hereinafter, the reference sign of any column AD circuit is designated as 15X) while remaining as a multi-line bus.

The column AD circuit 15X includes a capacitive DAC (second converter) 151, a comparator 152, a logic circuit 154, and two switches for initialization (hereinafter, simply referred to as switches) 153a and 153b. The capacitive DAC 151 receives, as an input, the reference voltage REF output from the reference voltage generator 17 and outputs a SAR reference voltage SARREF for successive approximation. Note that for details of the capacitive DAC 151, refer to Japanese Patent Application Laid-open No. 2016-39586, for example. However, the capacitive DAC 151 is not limited to the configuration disclosed in Japanese Patent Application Laid-open No. 2016-39586.

The output of the capacitive DAC 151 is connected to an inverting input node of the comparator 152 via wiring 156. Furthermore, the initialization voltage line INT is also connected to the inverting input node of the comparator 152 via wiring 158. The switch 153b is provided on the wiring 158 between the initialization voltage line INT and the inverting input node of the comparator 152.

The vertical signal line VSL is connected to a non-inverting input node of the comparator 152 via a capacitor C. Furthermore, the initialization voltage line INT is also connected to the non-inverting input node of the comparator 152 via the wiring 158. The switch 153a is provided on the wiring 158 between the initialization voltage line INT and the non-inverting input node of the comparator 152.

The comparator 152 compares a pixel signal input from the pixel group 13X via the vertical signal line VSL with the SAR reference voltage SARREF input from the capacitive DAC, and outputs the comparison result to the logic circuit 154.

The logic circuit 154 successively switches a SAR reference voltage SARREF to be output, by switching an internal connection relation based on the comparison result input from the comparator 152.

Furthermore, the logic circuit 154 has a holding (latch) function for propagating, to a subsequent stage, a digital value obtained by the comparator 152 AD-converting a pixel signal at a reset level and a digital value obtained by the comparator 152 AD-converting a pixel signal at a signal level. Furthermore, the logic circuit 154 may perform a CDS process for taking a difference between the digital value obtained by the comparator 152 AD-converting the pixel signal at the reset level and the digital value obtained by the comparator 152 AD-converting the pixel signal at the signal level. The digital value of the difference obtained by this CDS process may be temporarily held in a memory or the like (not illustrated). Alternatively, the digital values of the pixel signal at the reset level and the pixel signal at the signal level may be transferred to the subsequent stage without performing the CDS process, and the CDS process may be performed at the subsequent stage.

Thereafter, the logic circuit 154 sequentially outputs the digital value obtained by this CDS process to the output unit 19 as pixel data ADCOUT based on a shift operation by a horizontal selection signal input from the horizontal scanning circuit 18 at a predetermined timing. Alternatively, the logic circuit 154 outputs the digital values of the pixel signal at the reset level and the pixel signal at the signal level to the output unit 19 as pixel data without performing the CDS process.

Although not illustrated in particular because it is not directly related to the description of the present embodiment, other various signal processing circuits and the like may also be included in the components of the solid-state imaging device 10.

2.4 Operation of Solid-State Imaging Device

Next, a signal acquisition difference process that is a basic operation in the column AD circuit 15X of the solid-state imaging device 10, will be described.

In the present embodiment, as a mechanism for converting an analog pixel signal sensed by each unit pixel 131 of the pixel array unit 13 into a digital signal, a successive approximation register (SAR)-type AD conversion using a binary search algorithm is adopted. Details of the successive approximation register (SAR)-type AD conversion are disclosed in Japanese Patent Application Laid-open No. 2016-39586 and the like, for example. However, the successive approximation register (SAR)-type AD conversion is not limited to the method disclosed in Japanese Patent Application Laid-open No. 2016-39586, and various types of successive approximation register (SAR)-type AD conversion may also be adopted.

In the pixel signal output from the vertical signal line VSL, a signal level appears as a time series after a reset level including noise of a pixel signal as a reference level. When the first process is performed for the reference level (reset level, which is substantially equivalent to a reset component $\Delta V$), the second process is a process for the signal level obtained by adding a signal component to the reset level, which will be described in detail below.

For the first reading (P phase), before the first reading from the unit pixel 131 of a certain row to the vertical signal line VSL, the timing control unit 11 resets the pixel unit (unit pixel 131) and initializes the inverting and non-inverting input nodes of the comparator 152 by activating the switches 153a and 153b. Due to this operation, a variation of the reset level of each unit pixel 131 and an offset voltage of the comparator 152 itself when the comparator 152 has an auto-zero configuration can be stored and absorbed in the capacitor C serving as a sample/hold unit and a capacitive element of the capacitive DAC 151. After the initialization, the switches 153a and 153b are deactivated and the first reading (P phase) is started.

Note that the "variation of the reset level" is a concept including reset noise of a pixel (correctly, a pixel signal) and a threshold variation. Furthermore, the reset noise of the pixel is a concept including kTC noise at the time of reset that is generated in a pixel floating diffusion unit, kTC noise at the time of initialization in the non-inverting and inverting input nodes of the comparator 152, and the like.

The reference voltage generators 17 output the reference voltage REF to be supplied to the capacitive DAC 151 in each column AD circuit 15X. In order for the logic circuit 154 to generate a SAR reference voltage SARREF for converting (sampling) the next bit via a control line 157 based on the comparison result of the comparator 152, the capacitive DAC 151 selects an appropriate voltage from the reference voltage REF, connects the selected voltage to the capacitive DAC 151, and inputs the generated SAR reference voltage SARREF to the inverting input node of the comparator 152. The comparator 152 repeats, from the MSB to the LSB, an operation of comparing the input SAR reference voltage SARREF and the pixel signal voltage of a certain vertical signal line VSL supplied from the pixel array unit 13, thereby converting the pixel signal voltage appearing in the vertical signal line VSL into a digital value.

At the time of the first reading, the reset level at the pixel signal voltage is detected by the comparator 152 and is AD-converted, so that the reset component $\Delta V$ of the unit pixel 131 is read.

In the reset component $\Delta V$, noise that varies for each unit pixel 131 is included as an offset.

In addition, the non-inverting and inverting input nodes of the comparator 152 are initialized by an initialization pulse, so that an operating point of the first reading potential is set.

In the subsequent second reading (D phase), in addition to the reset component $\Delta V$, a signal component corresponding to the amount of incident light for each unit pixel 131 is read, and the same operation as the first reading is performed.

Then, the column AD circuit 15X performs a CDS process for taking a difference between the digital value at a reset level obtained in the first reading and a digital value at a signal level obtained in the second reading, thereby acquiring image data in which noise signal components called fixed pattern noise or reset noise have been reduced or removed. Alternatively, the column AD circuit 15X transmits the digital values of the pixel signal at the reset level and the pixel signal at the signal level to the subsequent stage without performing the CDS process, and performs the CDS process at the subsequent stage, thereby acquiring image data in which noise signal components called fixed pattern noise or reset noise have been reduced or removed.

As described above, the inverting and non-inverting input nodes of the comparator 152 are initialized and then the AD conversion process is performed by deactivating the switches 153a and 153b, so that the kTC noise generated by the sample/hold of the initialization pulse in the inverting and non-inverting input nodes of the comparator 152 before the first reading can be removed by the CDS process. That is, it is possible to acquire a pixel signal only for the signal component corresponding to the amount of incident light for each unit pixel 131 without being affected by the kTC noise.

2.5 Problems of Column AD Conversion

Next, the problems of the aforementioned successive approximation register-type column AD conversion will be described. As described above, each column AD circuit 15X according to the present embodiment performs the successive approximation register-type AD conversion process for each of the reset level (reset potential) and the signal level (signal potential) and performs the CDS process for taking a difference between the digital value at the reset level and the digital value at the signal level obtained by the AD conversion process, thereby generating digital pixel data for each unit pixel 131.

In the successive approximation register-type AD conversion method, the inverting and non-inverting input nodes of the comparator 152 are initialized before the AD conversion and a variation of the reset level of the pixel signal output from the unit pixel 131 and noise caused by the kTC noise and the like at the time of initializing the internal nodes of the comparator 152 are removed. However, actually, in the operation of the comparator 152, not all noise can be completely removed and some components may remain.

Here, in considering the noise component remaining even after the initialization operation by the initialization pulse for the inverting and non-inverting input nodes of the comparator 152, examples of the noise component include a feedthrough variation occurring when the initialization pulse is turned off, an inter-column transistor variation of the comparator 152, an inter-column variation of the capacitive DAC 151, and the like.

Furthermore, the noise through the initialization pulse includes a fixed point variation determined by feedthrough and charge injection of a switch transistor for initializing the inverting and non-inverting input nodes of the comparator which occur when the comparator initialization pulse is inactive (off: L level in the present example), or the kTC noise.

Therefore, due to the noise through the control line propagating the initialization pulse, the noise component in a time direction may be superimposed on the reference voltage REF.

Furthermore, since the initialization pulse has a delay due to parasitic resistance and capacitance, there is a difference in the time when the switch transistor for the initialization pulse of each vertical column is turned off. Therefore, the noise component generated when the initialization pulse for the inverting and non-inverting input nodes of the comparator 152 is turned off may reach the gates of the transistors of the inverting and non-inverting input nodes of the comparator 152 in which the comparator initialization pulse has not been turned off, via the initialization voltage line INT, and thus, the initialization potential of the transistors may be changed. This phenomenon occurs in the form of a differential input gate terminal potential variation for each column at the time of initialization.

Such a variation causes different quantization errors, different AD conversion results, and different initialization potentials for each column. When the AD conversion has a low gain, the value of 1LSB is large and quantization noise is also large.

When the AD conversion result at this time is output as an image, it becomes an image in which vertical stripe-shaped noise is generated.

This is because the variation of the inter-column transistor of the comparator 152 and the variation of the capacitive DAC 151 that are arranged in each column, and the like occur in the same manner when each row is read and the AD conversion result of the reset level serving as a reference of a difference process takes only a substantially constant value in the same column, particularly when the gain is low. Furthermore, not only quantization, but also a component that takes only a substantially constant value in the same column, such as the variation of the inter-column transistor and the variation of the capacitive DAC 151, may also cause fixed pattern noise.

Hereinafter, the quantization error will be described. When the input is analog and the output is digital, the value is rounded in units of 1LSB. For example, it is assumed that a signal for 4.5LSB is uniformly input to the reset level. Since it is not possible to digitally express numbers below the decimal point, the input pixel signal is converted into a digital value rounded in units of 1LSB. For example, when a signal for 4.5LSB is input uniformly in all columns, since the result of a difference process in a digital domain has a quantization error, it is distributed in a range with the quantization error of 4LSB or 5LSB and ±0.5LSB added.

As described above, when the difference process is performed in the digital domain, the problem of the quantization error always occurs.

Next, when data in the columns passing through the same comparator 152 is almost constant and the difference process is performed between the AD conversion result of the reset level in which only the inter-column variation exists and the AD conversion result of the signal level in which uniform signals overlap, how the AD conversion results change is considered.

When signal levels to be handled are the same, since the data in the columns passing through the same comparator 152 always takes a constant value, the quantization error always overlaps in the same way, but the spread of the quantization error is different for each column.

Consequently, in the result obtained by performing the difference process between the AD conversion result of the reset level and the AD conversion result of the signal level, a quantization error of ±0.5LSB is accumulated for each column, so that vertical stripe-shaped noise caused by the quantization error is visible in an image obtained by the result.

That is, a noise variation due to the quantization error during the difference process also occurs during the AD conversion of each row in the same way, and occurs in an image as the vertical stripe-shaped noise.

As described above, in the column AD circuit 15X of the present embodiment that performs the difference process in the digital domain, the generation of the vertical stripe-shaped noise due to the quantization error during the difference process is an unavoidable problem. Particularly, at the time of low gain where the width of 1LSB during the AD conversion becomes wide, in other words, when the resolution of the AD conversion becomes rough (low), the noise is strongly generated as an image as the width of 1LSB becomes wider.

As described above, in the column AD circuit 15X adopted in the present embodiment, the vertical stripe-shaped noise is caused by a combination of two factors: the quantization error that occurs during the difference process (CDS process) in the digital domain; and the fact that the AD conversion result for the reset level serving as a reference of the difference process in the digital domain takes only a constant value or a value with almost no difference within the same column.

Of these, the quantization error is an essential problem as long as the AD conversion is performed. However, it is possible to avoid quantization vertical streaks by shifting a quantization point for each row (for example, changing the degree of settling the inverting and non-inverting input nodes of the comparator 152 at the time of initialization). Furthermore, it is considered that the variation for each column that occurs in the difference processing result between the AD conversion result of the reset level and the AD conversion result of the signal level can be avoided by taking measures to prevent the variation from being accumulated for each column. Hereinafter, these avoidance methods will be described in detail.

2.6 Fixed Pattern Noise Reduction Method

Next, a fixed pattern noise reduction method according to the present embodiment will be described. Note that for the quality of two-dimensional spatial noise added to the reset level of a pixel signal by the fixed pattern noise reduction method according to the present embodiment, refer to Non-Patent Literature 1 described above, for example.

In the present embodiment, as a method for reducing the fixed pattern noise, as described above, by randomly changing the bias current (reading current for the unit pixel 131) of the vertical signal line VSL or randomly changing settling involved in the initialization of the comparator 152 or the settling state of the vertical signal line VSL when the pixel reset of the unit pixel 131 is completed, a pixel signal supplied from the pixel array unit 13 to the column processing unit 15 is allowed to include noise signals having different noise levels in two dimensional space. The noise level described here means randomization of the settling state. Hereinafter, a specific example will be described.

2.6.1 First Method

First, a first method for reducing the fixed pattern noise will be described in detail with reference to the drawings. In the first method, an initialization potential at the initialization end time is changed by changing settling related to the initialization of the inverting and non-inverting input nodes of the comparator 152.

In addition, in the first method, the initialization voltage INT is randomly changed, so that an initialization potential level before the start of the P phase includes noise signals having different noise levels in two dimensional space. With this, it is possible to randomly generate different quantization errors, different AD conversion results, and different initialization potentials for each column, so that it is possible to reduce vertical stripe-shaped fixed pattern noise having column correlation.

Figure 3:
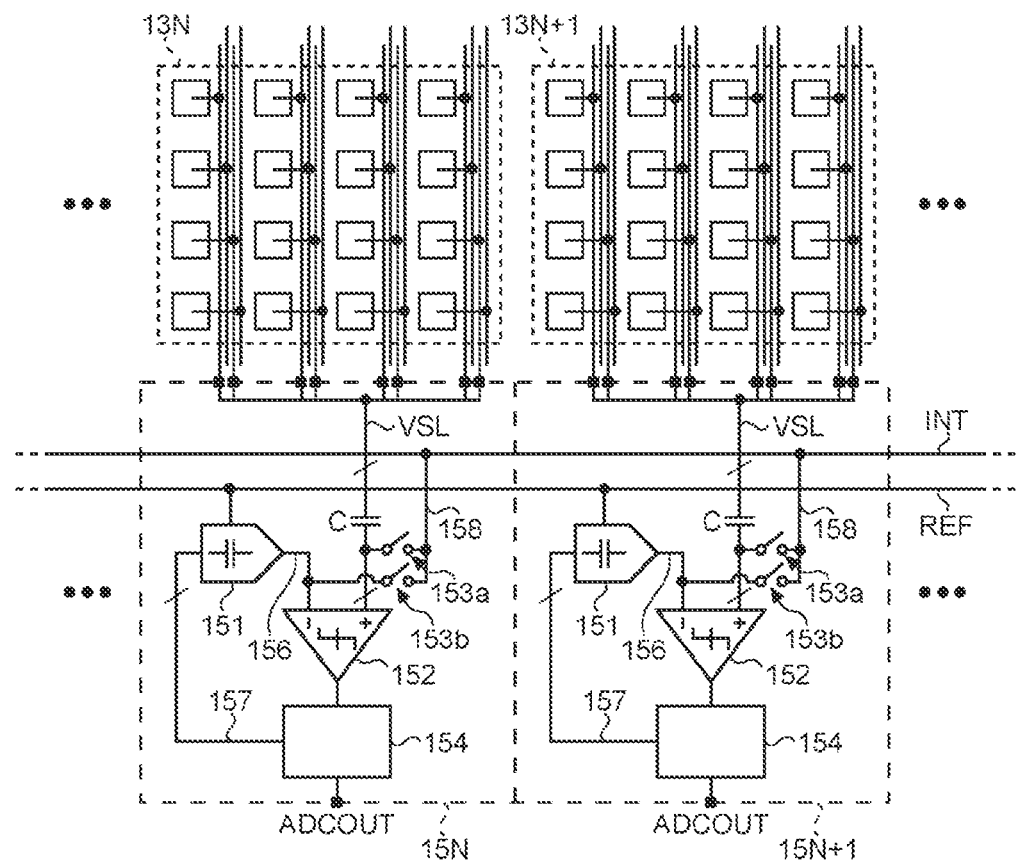
FIG. 3 is a diagram illustrating a schematic configuration example of the pixel array unit and the column processing unit extracted from FIG. 2 in describing a first method according to the first embodiment.
Figure 4:
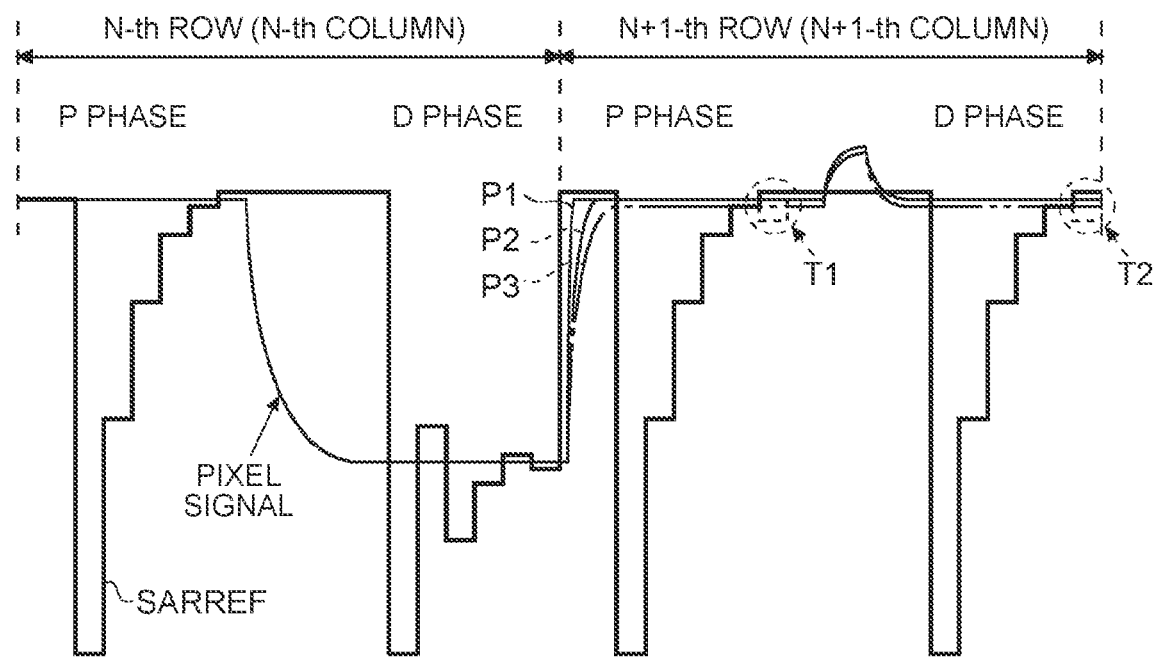
FIG. 4 is an operation waveform diagram for explaining the first method according to the first embodiment.

FIG. 3 is a diagram illustrating a schematic configuration example of the pixel array unit and the column processing unit extracted from FIG. 2 in describing the first method. FIG. 4 is an operation waveform diagram for explaining the first method. As illustrated in FIG. 3 and FIG. 4, in the present invention, attention is paid to a pixel group 13N and a column AD circuit 15N in the N-th row (N is an integer of 1 or more) and a pixel group 13N+1 and a column AD circuit 15N+1 in the N+1-th row.

As illustrated in FIG. 4, in the first method, by changing the initialization voltage INT at the time of initializing the inverting and non-inverting input nodes of the comparator 152 before the precharge phase (P phase) when the reset level is read from each unit pixel 131, settling is changed as in pixel signals P1 to P3 illustrated in FIG. 4, for example. The pixel signals P1 to P3 are examples and not limiting.

In the first method, the voltage value of the initialization voltage INT is randomly changed for each row such that the settling state at the timing of a control pulse termination of the switch that applies the initialization voltage INT is randomly changed for each row. In the examples illustrated in FIG. 3 and FIG. 4, it is assumed that the voltage value of an initialization voltage INT when the inverting and non-inverting input nodes of the comparator 152 are initialized before the start of the P phase of the unit pixel 131 belonging to the pixel group 13N in the N-th row is different from that of an initialization voltage INT when the inverting and non-inverting input nodes of the comparator 152 are initialized before the start of the P phase of the unit pixel 131 belonging to the pixel group 13N+1 in the N+1-th row.

Figure 5:
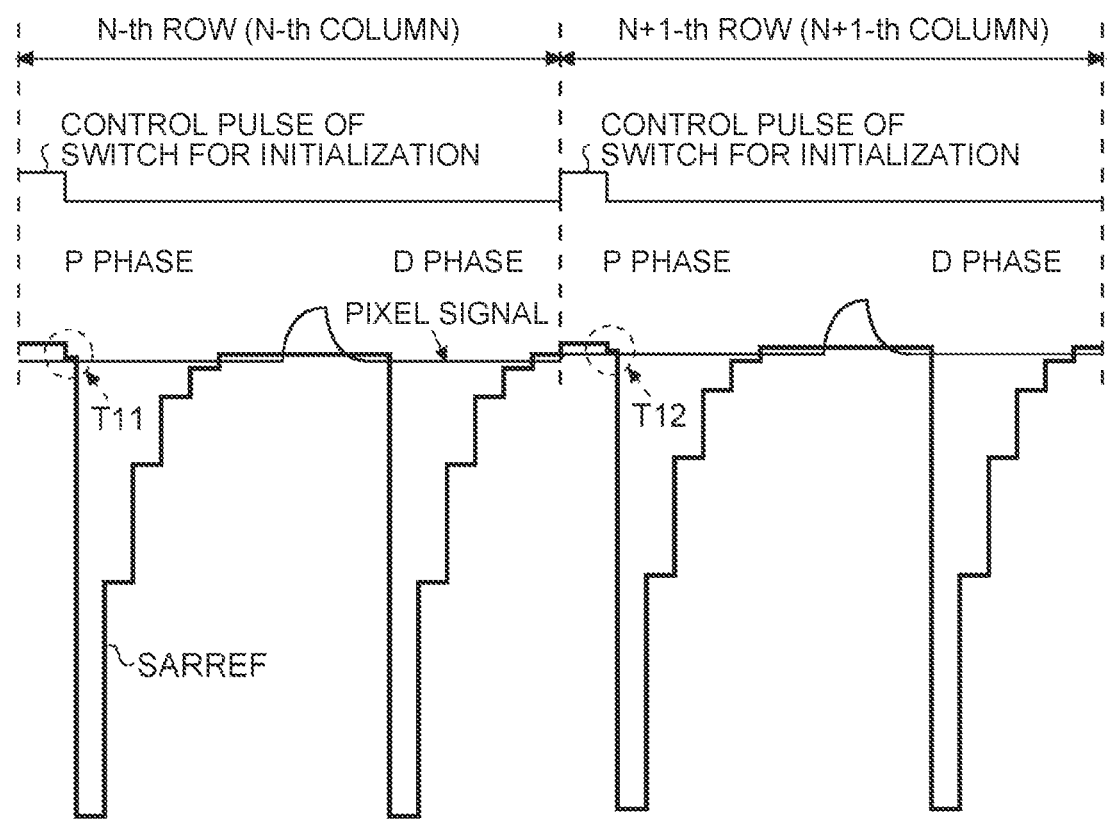
FIG. 5 is an operation waveform diagram for explaining the first method according to the first embodiment.

Specifically, in the present embodiment, the inverting and non-inverting input nodes of the comparator 152 are controlled using the initialization voltages INT. With this, the initialization voltage lines INT and the on-resistance of the switches 153a and 153b for initializing the inverting and non-inverting input nodes of the comparator 152 are changed, so that a time constant, charge injection of the switches 153a and 153b, and the like are also changed. With this, an initialization potential before the start of the P phase is controlled for each row. FIG. 5 illustrates an example in which the initialization potential is changed.

In FIG. 4, the pixel signal P1 input from the vertical signal line VSL to the non-inverting input node of the comparator 152 via the capacitor C is an example in which the initialization voltage INT when the reset level is read from the unit pixel 131 belonging to the pixel group 13N+1 in the N+1-th row has the same voltage value as the initialization voltage INT when the reset level is read from the unit pixel 131 belonging to the pixel group 13N in the N-th row. The pixel signal P2 is an example in which the initialization voltage INT when the reset level is read from the unit pixel 131 belonging to the pixel group 13N+1 in the N+1-th row is slightly changed with respect to the initialization voltage INT when the reset level is read from the unit pixel 131 belonging to the pixel group 13N in the N-th row. The pixel signal P3 is an example in which the initialization voltage INT when the reset level is read from the unit pixel 131 belonging to the pixel group 13N+1 in the N+1-th row is significantly changed with respect to the initialization voltage INT when the reset level is read from the unit pixel 131 belonging to the pixel group 13N in the N-th row.

As can be seen by referring to the pixel signals P1 to P3 and the reference voltage SARREF output from the capacitive DAC 151 in FIG. 4, in the cases (pixel signals P1 and P2) where the initialization voltage INT when the reset level is read from the unit pixel 131 belonging to the pixel group 13N+1 in the N+1-th row is the same as or slightly changed with respect to the initialization voltage INT when the reset level is read from the unit pixel 131 belonging to the pixel group 13N in the N-th row, there is no change in the result of the comparison performed by the comparator 152 to the reset level read from the unit pixel 131 belonging to the pixel group 13N+1 in the N+1-th row. On the other hand, in the case (pixel signal P3) where the initialization voltage INT when the reset level is read from the unit pixel 131 belonging to the pixel group 13N+1 in the N+1-th row is significantly changed with respect to the initialization voltage INT when the reset level is read from the unit pixel 131 belonging to the pixel group 13N in the N-th row, as indicated by the broken line in a region T1 of FIG. 4, there is a difference in the quantization error and the AD conversion result in the result of the comparison performed by the comparator 152 with respect to the reset level read from the unit pixel 131 belonging to the pixel group 13N+1 in the N+1-th row.

This means that by randomly changing the initialization voltage INT for each row, noise signals having different noise levels in two dimensional space are superimposed on the reset level. Such noise signals are superimposed on the reset level, so that it is possible to reduce the vertical stripe-shaped fixed pattern noise having column correlation.

As described above, by controlling the voltage value of the initialization voltage INT and randomly changing the voltage value of the initialization voltage INT for each row, it is possible to randomly change, for each row, the initialization settling state at the timing of the control pulse termination of the switch that applies the initialization voltage INT. In other words, the noise signals having different noise levels in two dimensional space can be superimposed on the initialization potential read from each unit pixel 131 and input to the comparator 152. As a consequence, it is possible to reduce the vertical stripe-shaped fixed pattern noise having column correlation.

In addition to the first method, the settling of the vertical signal line VSL is randomly changed by randomly changing a current of an operating current (the reading current source unit in FIG. 1) of a pixel source follower for each row, so that it is also possible to reduce the vertical stripe-shaped fixed pattern noise having column correlation.

2.6.1.1 Example of Initialization Voltage Generator

Hereinafter, an example of the initialization voltage generator 161 according to the first method will be described in detail with reference to the drawings.

2.6.1.1.1 First Example

Figure 6:
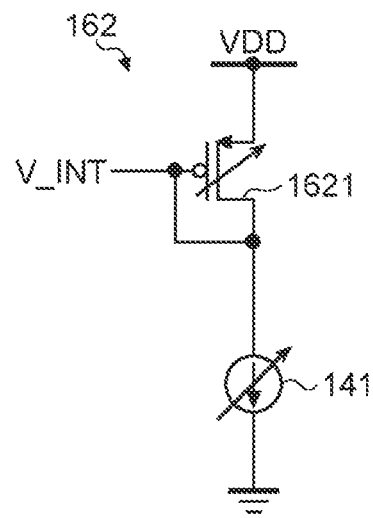
FIG. 6 is a circuit diagram illustrating a schematic configuration example of an initialization voltage generator according to a first example of the first method in the first embodiment.

FIG. 6 is a circuit diagram illustrating a schematic configuration example of an initialization voltage generator according to a first example. As illustrated in FIG. 6, an initialization voltage generator 162 according to the first example has a bias circuit configuration in which a PMOS transistor 1621 with the source connected to a power supply voltage VDD and the gate and the drain short-circuited, is connected to the ground GND via a variable current source unit 141.

In such a configuration, the constant of the PMOS transistor 1621, for example, the numbers of gate-length fingers and multiple fingers are set to be variable for each row, and the numbers of gate-length fingers and multiple fingers are configured to be switchable using, for example, a random number or the like (may be a pseudo-random number), so that it is possible to randomly change the voltage value of the initialization voltage INT for each row.

Alternatively, also in a configuration in which the current value of the variable current source unit 141 can be switched using, for example, a random number or the like (may be a pseudo-random number), it is possible to randomly change the voltage value of the initialization voltage INT for each row.

Note that whether to randomly change any one of the constant of the PMOS transistor 1621 and the variable current source unit 141 for each row or whether to randomly change both of them for each row may be appropriately selected as necessary. Furthermore, as the random number, for example, non-regular information such as a random number generated by a random number generator and or like (not illustrated) disposed in the accessory region or the like may be used.

2.6.1.1.2 Second Example

Figure 7:
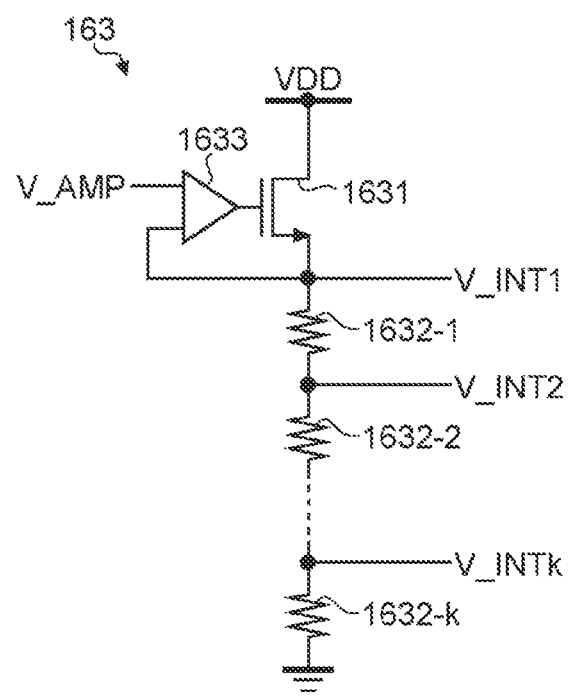
FIG. 7 is a circuit diagram illustrating a schematic configuration example of an initialization voltage generator according to a second example of the first method in the first embodiment.

FIG. 7 is a circuit diagram illustrating a schematic configuration example of an initialization voltage generator according to a second example. As illustrated in FIG. 7, an initialization voltage generator 163 according to the second example includes an NMOS transistor 1631 in which a drain is connected to the power supply voltage VDD and a source is connected to the ground GND via a plurality of resistors 1632-1 to 1632-k connected in series, and an amplifier 1633 with the output connected to a gate of the NMOS transistor 1631. A voltage V_AMP output from a bias circuit (not illustrated) is input to one input terminal of the amplifier 1633. Furthermore, for example, a source potential of the NMOS transistor 1631 is input to the other input terminal of the amplifier 1633. Note that the bias circuit that supplies the voltage V_AMP may be linked to an AD conversion gain.

In such a configuration, the initialization voltage INT can be taken out from a connection part at a plurality of stages of the resistors 1632-1 to 1632-k connected in series. Therefore, voltages V_INT1 to V_INTk (k is an integer of 2 or more) at stages to be output as the initialization voltage INT may be switched using, for example, the switch (not illustrated). For example, in the case of adopting a configuration in which the switch is switched using a random number or the like (may be a pseudo-random number), it is possible to randomly change the voltage value of the initialization voltage INT for each row.

Alternatively, even in a configuration in which the voltage V_AMP input to the one input terminal of the amplifier 1633 from the bias circuit is switched using, for example, a random number or the like (may be a pseudo-random number), it is possible to randomly change the voltage value of the initialization voltage INT for each row.

Note that as the random number, for example, non-regular information such as a random number generated by a random number generator (not illustrated) disposed in the accessory region or the like may be used.

In the above, the two initialization voltage generators 162 and 163 have been exemplified as a specific example of the initialization voltage generator 161; however, the present disclosure is not limited thereto and it is possible to apply various circuit configurations as long as they can randomly change the voltage value.

2.6.2 Second Method

Next, a second method for reducing the fixed pattern noise will be described in detail with reference to the drawings. In the aforementioned first method, the initialization voltage INT is controlled to adjust initialization to be terminated in the state in which the pixel signal input from the vertical signal line VSL to the non-inverting input node of the comparator 152 via the capacitor C has not been sufficiently settled. On the other hand, in the second method, by adjusting the width of the control pulse of the switch that applies the initialization voltage INT, the initialization voltage INT is adjusted to be terminated in the state in which the pixel signal input from the vertical signal line VSL to the non-inverting input node of the comparator 152 via the capacitor C has not been sufficiently settled. Even in the second method, as in the first method, an adjustment amount of the width of the control pulse of the switch that applies the initialization voltage INT is randomly changed, so that noise signals having different noise levels in two dimensional space are included in the pixel signal input from the vertical signal line VSL to the non-inverting input node of the comparator 152 via the capacitor C. With this, it is possible to randomly generate different quantization errors and different initialization potentials for each row, so that it is possible to reduce the vertical stripe-shaped fixed pattern noise having column correlation.

Figure 8:
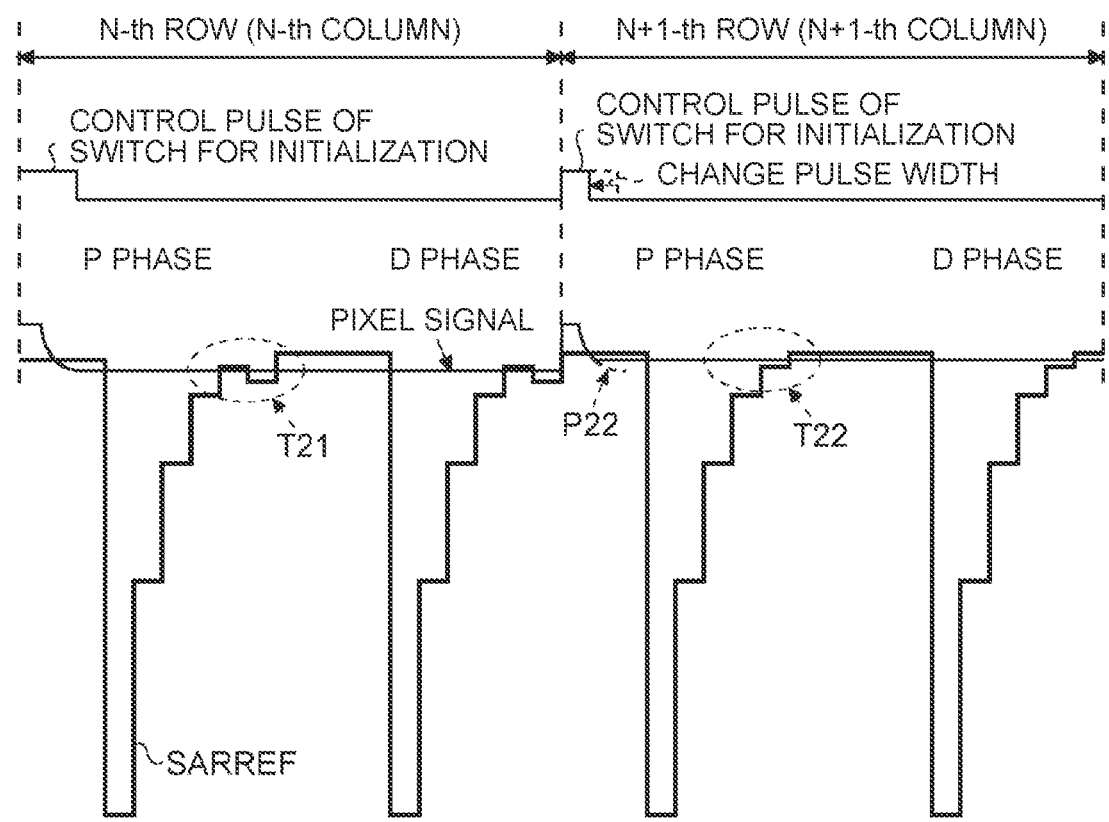
FIG. 8 is an operation waveform diagram for explaining a second method according to the first embodiment.

FIG. 8 is an operation waveform diagram for explaining the second method. Note that the configuration of the column AD circuit 15X according to the second method may be the same as that of the column AD circuit 15X illustrated in FIG. 3 according to the first method.

In the second method, at the time of initialization before the precharge phase (P phase) when the reset level is read from each unit pixel 131, before the reset level of the unit pixel 131 belonging to the pixel group 13X in the X-th row is read, the width of the control pulse of the switch that applies the initialization voltage INT to be input to the inverting input node and non-inverting input node of the comparator 152 in the column AD circuit 15X, is set to a sufficiently narrow width. The sufficiently narrow width means that the width of the control pulse of the switch that applies the initialization voltage INT is a narrow pulse width to be sufficiently shorter than the time required until the pixel signal input from the vertical signal line VSL to the inverting and non-inverting input nodes of the comparator 152 via the capacitor C is sufficiently settled.

Furthermore, in the second method, the control pulse width of the switch that applies the initialization voltage INT is randomly changed for each row such that the settling state of the pixel signal input from the vertical signal line VSL to the non-inverting input node of the comparator 152 via the capacitor C at the timing of the control pulse termination of the switch that applies the initialization voltage INT, is randomly changed for each row. In the example illustrated in FIG. 8, it is assumed that the initialization voltage INT when the inverting and non-inverting input nodes of the comparator 152 are initialized before the start of the P phase of the unit pixel 131 belonging to the pixel group 13N in the N-th row and the initialization voltage INT when the inverting and non-inverting input nodes of the comparator 152 are initialized before the start of the P phase of the unit pixel 131 belonging to the pixel group 13N+1 in the N+1-th row, are controlled by different pulse widths.

As described above, also by setting the control pulse width of the switch that applies the initialization voltage INT, to a sufficiently narrow width and setting the control pulse width of the switch that applies the initialization voltage INT, to a width that is randomly changed for each row, it is possible to achieve the same effects as those of the first method. Furthermore, also by changing the settling of the vertical signal line VSL by changing the pulse width of a reset signal of the pixel array unit 13 as well as the initialization pulse, it is possible to achieve an effect of randomizing the setting state.

2.6.3 Third Method

Figure 9:
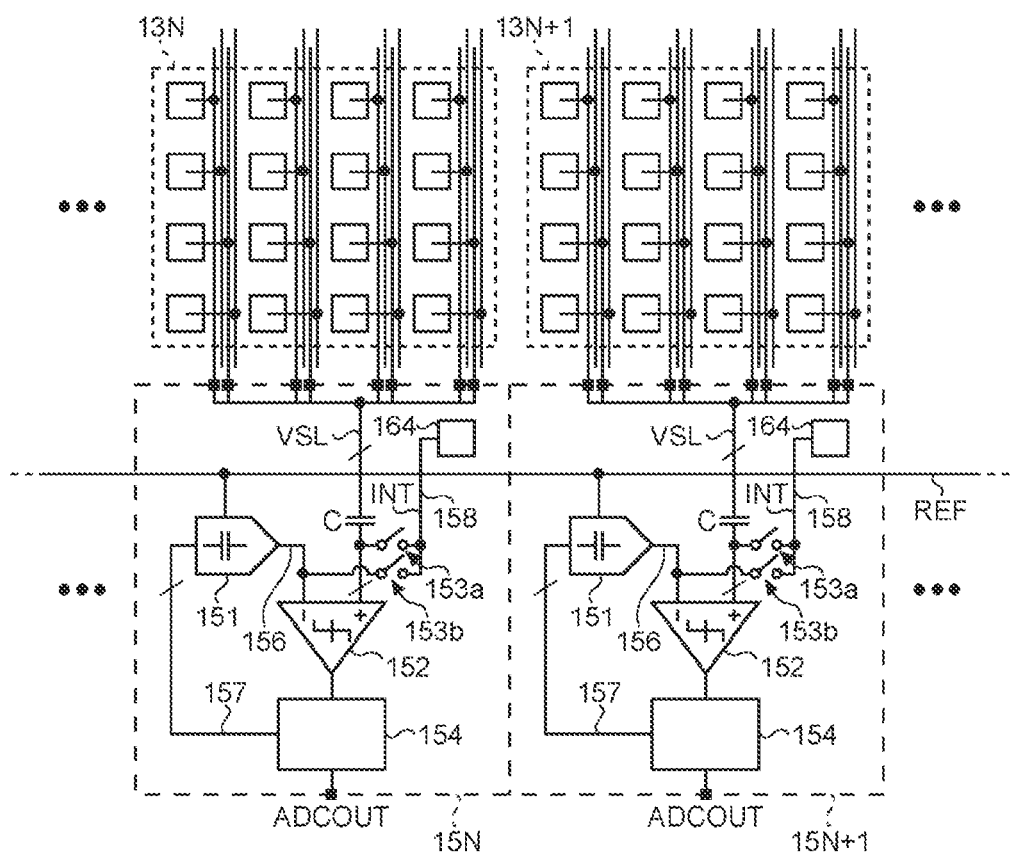
FIG. 9 is a diagram illustrating a schematic configuration example of the pixel array unit and the column processing unit extracted from FIG. 2 in describing a third method according to the first embodiment.

Next, a third method for reducing the fixed pattern noise will be described in detail with reference to the drawings. In the aforementioned first and second methods, the common initialization voltage generator 161 randomly supplies different initialization voltages INT and initialization pulses for each row to all vertical columns; however, the present disclosure is not limited to such a configuration. For example, as illustrated in FIG. 9, it is also possible to provide an initialization voltage generator 164 for each vertical column. Note that FIG. 9 illustrates a configuration in which the initialization voltage generator 164 is provided in each column AD circuit 15X; however, the present disclosure is not limited to such a configuration.

The initialization voltage generator 164 in each vertical column is controlled by the initialization voltage INT, for example, as in the first method, so that an initialization potential that is changed by the feedthrough, charge injection, or the like of the switch transistor is randomly changed for each row. With this, noise signals having different noise levels in two dimensional space are included in the pixel signal input from the vertical signal line VSL to the inverting and non-inverting input nodes of the comparator 152 via the capacitor C, so that it is possible to randomly generate different quantization errors and different initialization potentials for each row and thus to reduce the vertical stripe-shaped fixed pattern noise having column correlation.

Alternatively, the initialization voltage generator 164 in each vertical column sufficiently narrows the control pulse width of the switch that applies the initialization voltage INT to the inverting and non-inverting input nodes of the comparator 152 and randomly changes an adjustment amount of the pulse width for each row, for example, as in the second method. With this, so that it is possible to randomly generate different quantization errors and different initialization potentials for each row and thus to reduce the vertical stripe-shaped fixed pattern noise having column correlation.

Note that when the initialization voltage generator 164 is provided for each vertical column as in the third method, it is also possible to supply the control pulse width of the switch that randomly applies the voltage value or the initialization voltage INT not only for each row but also for each column. With this, it is also possible to reduce not only the vertical stripe-shaped fixed pattern noise having column correlation but also row direction (lateral direction) noise such as streaking.

However, the configuration in which the voltage value or the pulse width is randomly supplied not only for each row but also for each column is an example, and the present disclosure is not limited to such a configuration.

2.7 Operation and Effect

As described above, according to the present embodiment, the initialization voltage INT is randomly changed for each row and/or column, or the control pulse width of the switch that applies the initialization voltage INT is randomly changed for each row and/or column. Therefore, noise signals having different noise levels in two dimensional space are superimposed on the pixel signal input from the vertical signal line VSL to the inverting and non-inverting input nodes of the comparator 152 via the capacitor C, so that it is possible to generate different quantization errors and different initialization in two dimensional space. As a consequence, it is possible to reduce the generation of the vertical stripe-shaped fixed pattern noise having column correlation and the row direction (lateral direction) noise such as streaking.

3. Second Embodiment

Next, a second embodiment of the present disclosure will be described in detail with reference to the drawings. In the aforementioned first embodiment, the case where the column AD circuit 15X is of a successive approximation register (SAR) type has been exemplified; however, the fixed pattern noise reduction method according to the first embodiment can also be applied to a single slope-type column AD circuit. Note that in the following description, the same components as those according to the first embodiment are denoted by the same reference signs, and a description thereof will be omitted in order to avoid redundancy.

A solid-state imaging element according to the second embodiment is the same as the solid-state imaging element 1 illustrated in FIG. 1, except that the pixel array unit 13 is replaced with a pixel array unit 23, the column processing unit 15 is replaced with a column processing unit 25, and the reference voltage generator 17 is replaced with a DAC 27.

The DAC 27 is a reference voltage generator that outputs a sawtooth-shaped (also referred to as a ramp-like) reference voltage (voltage for comparison) RAMP that increases or decreases in a stepwise manner, instead of a constant reference voltage REF. Since the other configurations are the same as those of the solid-state imaging element 1 illustrated in FIG. 1, a detailed description thereof will be omitted.

Figure 10:
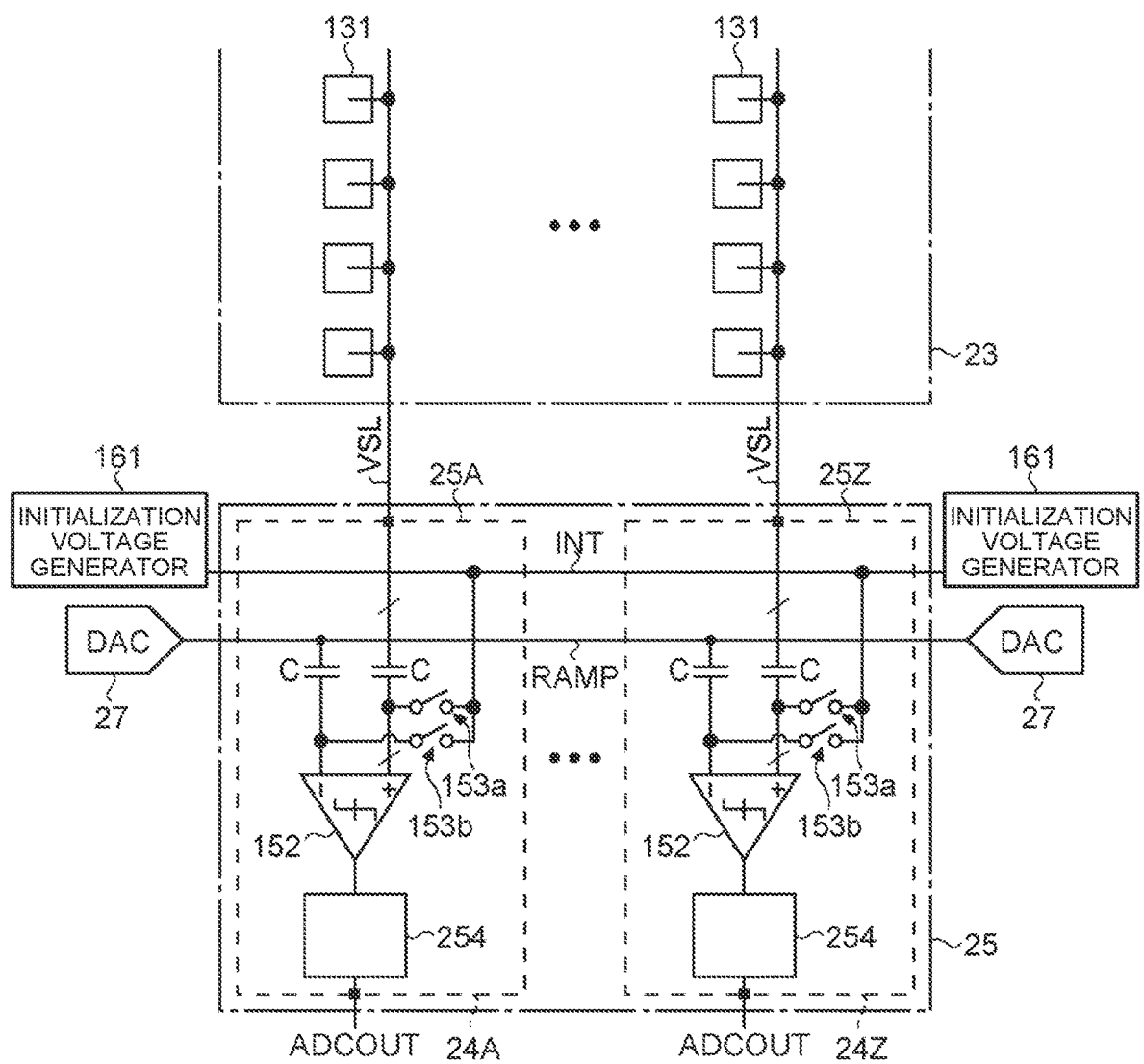
FIG. 10 is a circuit diagram illustrating a configuration example of a pixel array unit and a column processing unit according to a second embodiment.

FIG. 10 is a circuit diagram illustrating a configuration example of a pixel array unit and a column processing unit according to the present embodiment. Note that in FIG. 10, for simplification of description, the reading current source unit 14 is omitted. Furthermore, FIG. 10 illustrates the initialization voltage generator 161 as an example of the noise addition unit 16.

In the configuration illustrated in FIG. 10, the pixel array unit 23 and the column processing unit 25 are provided in the part called the column region in the solid-state imaging device 10 as in the first embodiment. On the other hand, the initialization voltage generator 161 and the DAC 27 are provided in the accessory region where the peripheral circuits such as the timing control unit 11 are arranged. The initialization voltage generator 161 may be provided at one end of the initialization voltage line INT or may be provided at both ends thereof. Similarly, the DAC 27 may be provided at one end of a reference voltage line to which the reference voltage RAMP is applied (hereinafter, for simplification of description, the reference sign of the reference voltage line is referred to as RAMP), or may be provided at both ends thereof. The initialization voltage generator 161 and the DAC 27 are provided at both ends thereof, respectively, so that it is possible to supply more stable initialization voltage INT and reference voltage RAMP.

As illustrated in FIG. 10, in the second embodiment, one column AD circuit 25 (first converter) X (column AD circuit 25X is any one of column AD circuits 25A to 25Z) is connected to one vertical signal line VSL. The pixel array unit 23 has, for example, a configuration in which a plurality of unit pixels 131 are connected in parallel to each vertical signal line VSL.

The column AD circuit 25X includes the comparator 152, a logic circuit 254, and the two switches 153a and 153b. That is, the column AD circuit 25X according to the present embodiment has the same configuration as the column AD circuit 15X according to the first embodiment, except that the logic circuit 154 is replaced with the logic circuit 254 and the capacitive DAC 151 is omitted. The reference voltage RAMP output from the DAC 27 is input to the inverting input node of the comparator 152, instead of the SAR reference voltage SARREF output from the capacitive DAC 151.

In the single slope-type AD conversion, after the AD conversion is started, based on the time until the signal levels of the reference voltage RAMP and a pixel signal input to the comparator 152 via the vertical signal line VSL coincide with each other, an analog pixel signal is converted into a digital signal. Note that for a detailed mechanism thereof, refer to Japanese Patent Application Laid-open No. 2008-60872, for example. However, the single slope-type AD conversion is not limited to the process disclosed in Japanese Patent Application Laid-open No. 2008-60872. Simply, the ramp-like reference voltage RAMP is supplied to the comparator 152 and simultaneously, counting with a clock signal is started, and a count value when an analog pixel signal input via the vertical signal line VSL exceeds a potential of the reference voltage RAMP is set as a digital value of the pixel signal.

Even in such a configuration in which the single slope-type AD conversion is performed, the initialization voltage INT or the control pulse width of the switch that applies the initialization voltage INT is randomly changed, as in the fixed pattern noise reduction method according to the first embodiment (for example, the first to the third methods). Therefore, noise signals having different noise levels in two dimensional space are superimposed on the pixel signal input from the vertical signal line VSL to the inverting and non-inverting input nodes of the comparator 152 via the capacitor C, so that it is possible to generate different quantization errors and different initialization potentials in two dimensional space. As a consequence, it is possible to reduce the generation of the vertical stripe-shaped fixed pattern noise having column correlation and the row direction (lateral direction) noise such as streaking.

Note that since the other configurations, operations, and effects are the same as those of the aforementioned first embodiment, a detailed description thereof will be omitted.

4. Third Embodiment

Next, a third embodiment of the present disclosure will be described in detail with reference to the drawings. In the present embodiment, the SAR reference voltage SARREF supplied to the comparator 152 from the capacitive DAC 151 included in each column AD circuit 15X is randomly changed for each row. With this, as in the aforementioned embodiments, it is possible to generate different quantization errors and different P shape levels in two dimensional space, so that it is possible to reduce the vertical stripe-shaped fixed pattern noise having column correlation.

In addition, in the present embodiment, the SAR reference voltage SARREF supplied to the comparator 152 from the capacitive DAC 151 included in each column AD circuit 15X is also randomly changed for each column. With this, it is also possible to reduce not only the vertical stripe-shaped fixed pattern noise having column correlation but also the row direction (lateral direction) noise such as streaking.

The schematic configuration example of the solid-state imaging device according to the present embodiment may be the same as that of the solid-state imaging device 10 using FIG. 1 in the first embodiment. Furthermore, the column AD circuit according to the present embodiment may also have the same configuration as the column AD circuit 15X described using FIG. 2 and other drawings in the first embodiment.

Figure 11:
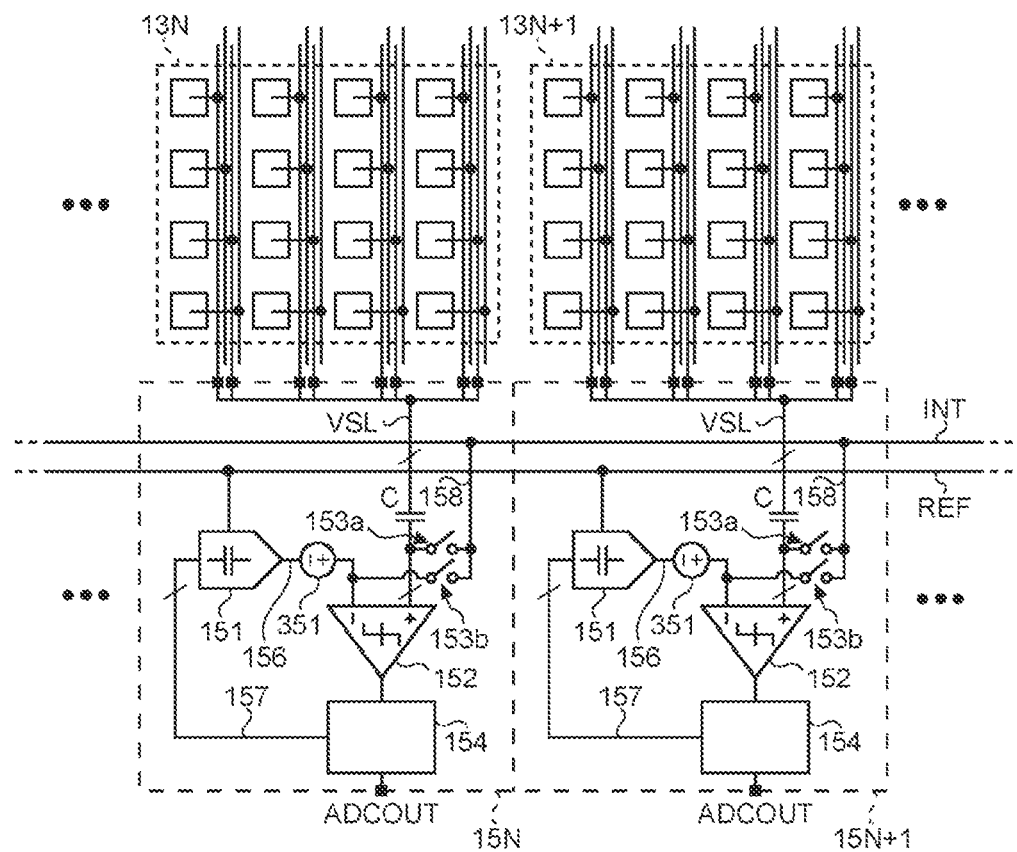
FIG. 11 is a diagram illustrating a schematic configuration example of the pixel array unit and the column processing unit extracted from FIG. 2 in describing a fixed pattern noise reduction method according to a third embodiment.
Figure 12:
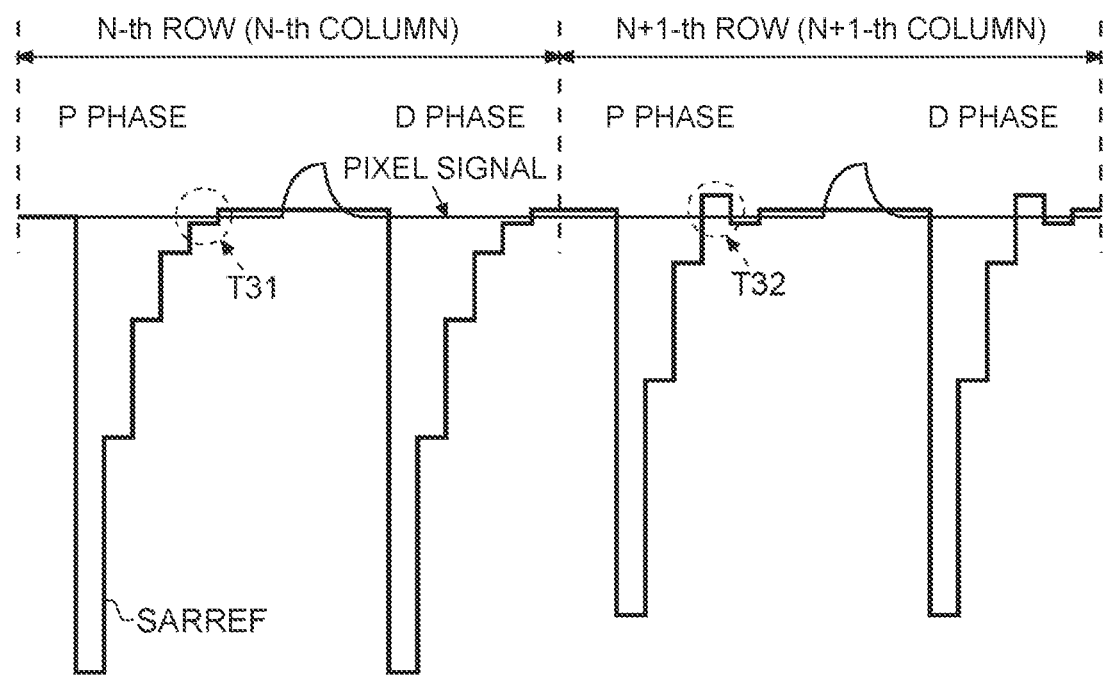
FIG. 12 is an operation waveform diagram for explaining the fixed pattern noise reduction method according to the third embodiment.

FIG. 11 is a diagram illustrating a schematic configuration example of a pixel array unit and a column processing unit extracted from FIG. 2 in describing a fixed pattern noise reduction method according to the third embodiment. FIG. 12 is an operation waveform diagram for explaining the fixed pattern noise reduction method according to the third embodiment. As illustrated in FIG. 11 and FIG. 12, in the present description, attention is paid to the pixel group 13N and the column AD circuit 15N in the N-th row (N is an integer of 1 or more) and the pixel group 13N+1 and the column AD circuit 15N+1 in the N+1-th row.

As illustrated in FIG. 11, a column AD circuit 15X according to the present embodiment has the same configuration as the column AD circuit 15X in the first embodiment, except that an offset 351 is added between the output of the capacitive DAC 151 and the inverting input node of the comparator 152.

For example, the offset 351 has a function of randomly adding different offset voltages to the SAR reference voltage SARREF that is output from the capacitive DAC 151, for each row and column. As described above, the different offset voltage is randomly added to the SAR reference voltage SARREF for each row and column, so that it is possible to generate different quantization errors and different P shape levels depending on pixel positions in two dimensional space, while the different quantization errors and different P shape levels do not fluctuate in time. As a consequence, it is possible to reduce the generation of the vertical stripe-shaped fixed pattern noise having column correlation and the row direction (lateral direction) noise such as streaking.

For example, in the example illustrated in FIG. 12, an offset voltage added by the offset 351 to the SAR reference voltage SARREF when a reset level S_RST read from the unit pixel 131 of the N-th row and N-th column is AD-converted (sampled), is set to be different from an offset voltage added by the offset 351 to the SAR reference voltage SARREF when the reset level S_RST read from the unit pixel 131 of the N+1-th row and N+1-th column is AD-converted (sampled), so that an AD conversion point (see region T31) of the N-th row and N-th column and an AD conversion point (see region T32) of the N+1-th row and N+1-th column are changed. As a consequence, as illustrated in the region T31 and the region T32, the result obtained by AD-converting (sampling) the reset level S_RST read from the unit pixel 131 of the N-th row and N-th column is different from the result obtained by AD-converting (sampling) the reset level S_RST read from the unit pixel 131 of the N+1-th row and N+1-th column.

As described above, in accordance with the fixed pattern noise reduction method according to the second embodiment, it is possible to change the quantization point of the comparator 152 for each row and column, so that it is possible to reduce vertical and horizontal stripe-shaped fixed pattern noise having column correlation and row correlation.

4.1 Addition Circuit of Offset

Figure 13:
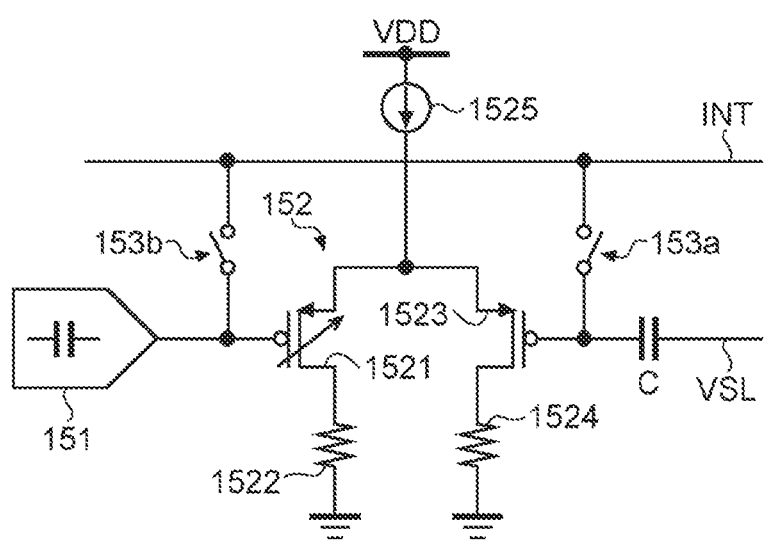
FIG. 13 is a circuit diagram illustrating an example of an offset addition circuit according to the third embodiment.

FIG. 13 illustrates an example of an addition circuit of the offset according to the third embodiment. FIG. 13 is a circuit diagram illustrating an example of the comparator 152. As illustrated in FIG. 13, the comparator 152 includes, for example, two PMOS transistors 1521 and 1523 in which sources are made common and connected to the power supply voltage VDD via a variable current source 1525, respectively, and drains are connected to the grounds GND via resistors 1522 and 1524, respectively.

In the configuration illustrated in FIG. 13, an addition circuit of the offset 351 can be implemented, for example, by using a PMOS transistor having a variable constant as the PMOS transistor 1521 constituting the input terminal of the capacitive DAC 151 in the comparator 152, that is, the inverting input node.

For example, the constant of the PMOS transistor 1521, for example, the number of fingers and multiple fingers are set to be variable for each row and/or column, and the number of fingers and multiple fingers are configured to be switchable using, for example, a random number and the like (may be a pseudo-random number), so that the constant of the PMOS transistor 1521 constituting the inverting input node, that is, the offset voltage of the offset 351 can be randomly changed for each row and column.

Alternatively, also in a configuration in which a plurality of PMOS transistors 1521 having different constants (the number of fingers, multiple fingers, and the like) are provided and any one of them is switched using a random number or the like (may be a pseudo-random number), the constant of the PMOS transistor 1521 constituting the inverting input node, that is, the offset voltage of the offset 351 can be randomly changed for each row and column.

Note that as the random number, for example, non-regular information such as a random number generated by a random number generator (not illustrated) disposed in the accessory and/or column region or the like may be used.

4.2 Operation and Effect

As described above, according to the present embodiment, different offset voltages are randomly added to the SAR reference voltage SARREF for each row and/or column. Therefore, the inversion timing of the comparator 152 and the AD conversion result can be scattered for each row and/or column, so that it is possible to generate different quantization errors and different P shape levels in two dimensional space. As a consequence, it is also possible to reduce not only the vertical stripe-shaped fixed pattern noise having column correlation but also the row direction (lateral direction) noise such as streaking.

Note that in the third embodiment, the case where different offset voltages are randomly added to the SAR reference voltage SARREF for each row and column has been exemplified; however, the present disclosure is not limited thereto and it is also possible to have a configuration in which different offset voltages are randomly added to the SAR reference voltage SARREF only for each row or only for column. Furthermore, since the other configurations, operations, and effects are the same as those of the aforementioned embodiments, a detailed description thereof will be omitted.

5. Fourth Embodiment

Next, a fourth embodiment of the present disclosure will be described in detail with reference to the drawings. In the aforementioned third embodiment, different offset voltages are randomly added between the output of the capacitive DAC 151 and the inverting input node of the comparator 152 for each row and/or column, so that the SAR reference voltage SARREF at the time of AD-converting the reset level (P phase level) is randomly changed for each row and/or column. On the other hand, in the fourth embodiment, the SAR reference voltage SARREF itself that is output by the capacitive DAC 151 setting the reset level (P phase level), is set to a voltage value randomly different for each row and/or column. With this, as in the aforementioned embodiments, it is possible to generate different quantization errors and different P shape levels in two dimensional space, so that it is possible to reduce the generation of the vertical stripe-shaped fixed pattern noise having column correlation and the row direction (lateral direction) noise such as streaking. Here, the reset level and the P phase level are used in the same definition.

The schematic configuration example of a solid-state imaging device according to the present embodiment may be the same as that of the solid-state imaging device 10 described using FIG. 1 in the first embodiment. Furthermore, a column AD circuit according to the present embodiment may also have the same configuration as the column AD circuit 15X described using FIG. 2 in the first embodiment.

However, in the present embodiment, a code (hereinafter, referred to as a reset code) that is applied from the logic circuit 154 to the capacitive DAC 151 when the reset level is set, is randomly switched for each row and/or column. With this, the SAR reference voltage SARREF itself that is output by the capacitive DAC 151 when the reset level is set is set to a reset code randomly different for each row and/or column.

Figure 14:
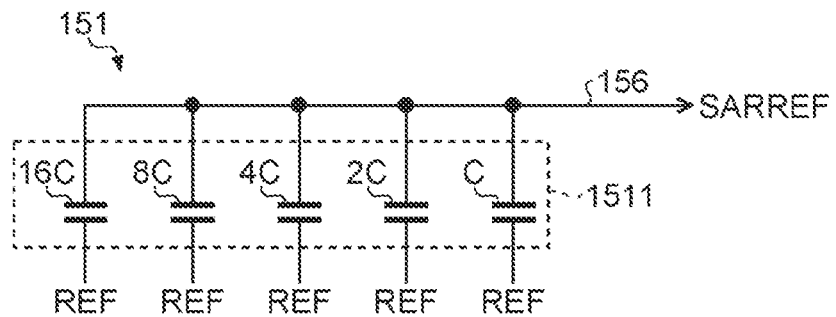
FIG. 14 is a diagram for explaining an example of a connection relation of the N-th row and N-th column in a capacitive DAC when a reset code applied to the capacitive DAC at the time of AD-converting a reset level is randomly switched for each row and column, according to a fourth embodiment.
Figure 15:
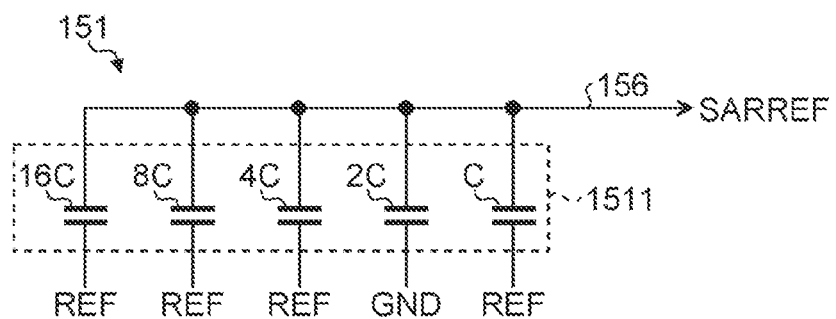
FIG. 15 is a diagram for explaining an example of a connection relation of the N+1-th row and N-th column in the capacitive DAC when the reset code applied to the capacitive DAC at the time of AD-converting the reset level is randomly switched for each row and column, according to the fourth embodiment.
Figure 16:
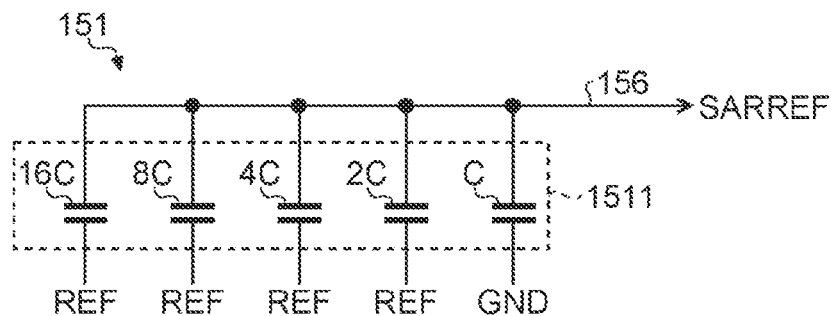
FIG. 16 is a diagram for explaining an example of a connection relation of the N-th row and N+1-th column in the capacitive DAC when the reset code applied to the capacitive DAC at the time of AD-converting the reset level is randomly switched for each row and column, according to the fourth embodiment.

FIG. 14 to FIG. 16 are diagrams for explaining examples of connection relations in the capacitive DAC when the reset code applied to the capacitive DAC at the time of AD-converting the reset level is randomly switched for each row and column. Note that FIG. 14 illustrates an example of a connection relation of the N-th row and N-th column, FIG. 14 illustrates an example of a connection relation of the N+1-th row and N-th column, and FIG. 16 illustrates an example of a connection relation of the N-th row and N+1-th column.

As illustrated in FIG. 14 to FIG. 16, the capacitive DAC 151 includes a capacitor group 1511 including a plurality of capacitors connected in parallel. The capacitance of the capacitors included in the capacitor group 1511 may be the same or different from each other. In the examples illustrated in FIG. 14 to FIG. 16, the capacitor group 1511 includes five capacitors and the capacitance thereof is different from each other. In the drawings, 'C' to '16C' attached to the capacitors indicate their capacitance ratios. For example, the capacitance 2C is twice, the capacitance 4C is four times, the capacitance 8C is eight times, and the capacitance 16C is 16 times, with respect to the capacitance C.

As illustrated in FIG. 14, for example, when setting the reset level of the unit pixel 131 of the N-th row and N-th column, it is assumed that all the capacitors included in the capacitor group 1511 are connected to the reference voltage line REF that transmits the reference voltage REF from the logic circuit 154 to the capacitive DAC 151. On the other hand, as illustrated in FIG. 15, when setting the reset level of the unit pixel 131 of the N+1-th row and N-th column, it is assumed that, for example, the capacitor having the capacitance 2C among the capacitors included in the capacitor group 1511 is connected to the ground GND and the remaining capacitors are connected to the reference voltage line REF from the logic circuit 154 to the capacitive DAC 151. Moreover, as illustrated in FIG. 16, when setting the reset level of the unit pixel 131 of the N-th row and N+1-th column, it is assumed that, for example, the capacitor having the capacitance C among the capacitors included in the capacitor group 1511 is connected to the ground GND and the remaining capacitors are connected to the reference voltage line REF from the logic circuit 154 to the capacitive DAC 151.

As described above, a combination of connection destinations of the capacitors in the capacitive DAC 151 is randomly switched for each row and column, so that it is possible to randomly change the reset code of the SAR reference voltage SARREF for each row and/or column. Therefore, it is possible to generate different quantization errors and different P shape levels in two dimensional space, so that it is possible to reduce the generation of the vertical stripe-shaped fixed pattern noise having column correlation and the row direction (lateral direction) noise such as streaking.

Note that in the configurations illustrated in FIG. 14 to FIG. 16, the reference voltage REF input to each capacitor and the ground GND are merely examples and may be variously modified.

The voltage value of the reference voltage REF can be calculated, as an example, as expressed by the following Equation (1) when a range voltage of the unit pixel 131 is set to Drange_pix, a transfer gain from the vertical signal line VSL to the non-inverting input node of the comparator 152 is set to Gain_pix-to-cm, a transfer gain from the reference voltage generator 17 to the inverting input node of the comparator 152 is set to Gain_ref-to-cm, and an analog gain is set to AG.

$$REF=(D_{range\_pix} \times Gain\_pix\text{-}to\text{-}cm)/(Gain\_ref\text{-}cm \times AG) \quad (1)$$

5.1 Modification of Capacitive DAC

Next, a modification of the capacitive DAC 151 will be described with some examples.

5.1.1 First Modification

Figure 17:
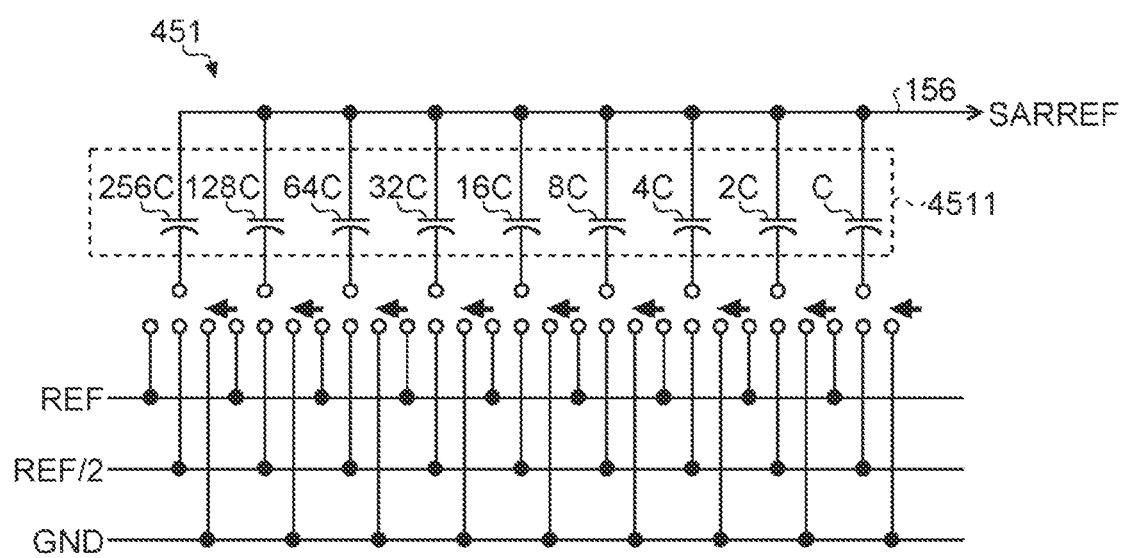
FIG. 17 is a circuit diagram illustrating a schematic configuration example of a capacitive DAC according to a first modification of the fourth embodiment.

FIG. 17 is a circuit diagram illustrating a schematic configuration example of a capacitive DAC according to a first modification. As illustrated in FIG. 17, a capacitive DAC 451 according to the first modification includes more capacitors in a capacitor group 4511 than in the examples of the capacitive DAC 151 illustrated in FIG. 14 to FIG. 16. Furthermore, as a connection destination of each capacitor, in addition to the reference voltage REF and the ground GND, for example, an intermediate reference voltage REF/2 having a voltage level between the reference voltage REF and the ground GND is added. The intermediate reference voltage REF/2 may have a voltage level corresponding to half the reference voltage REF, for example.

5.1.2 Second Modification

Figure 18:
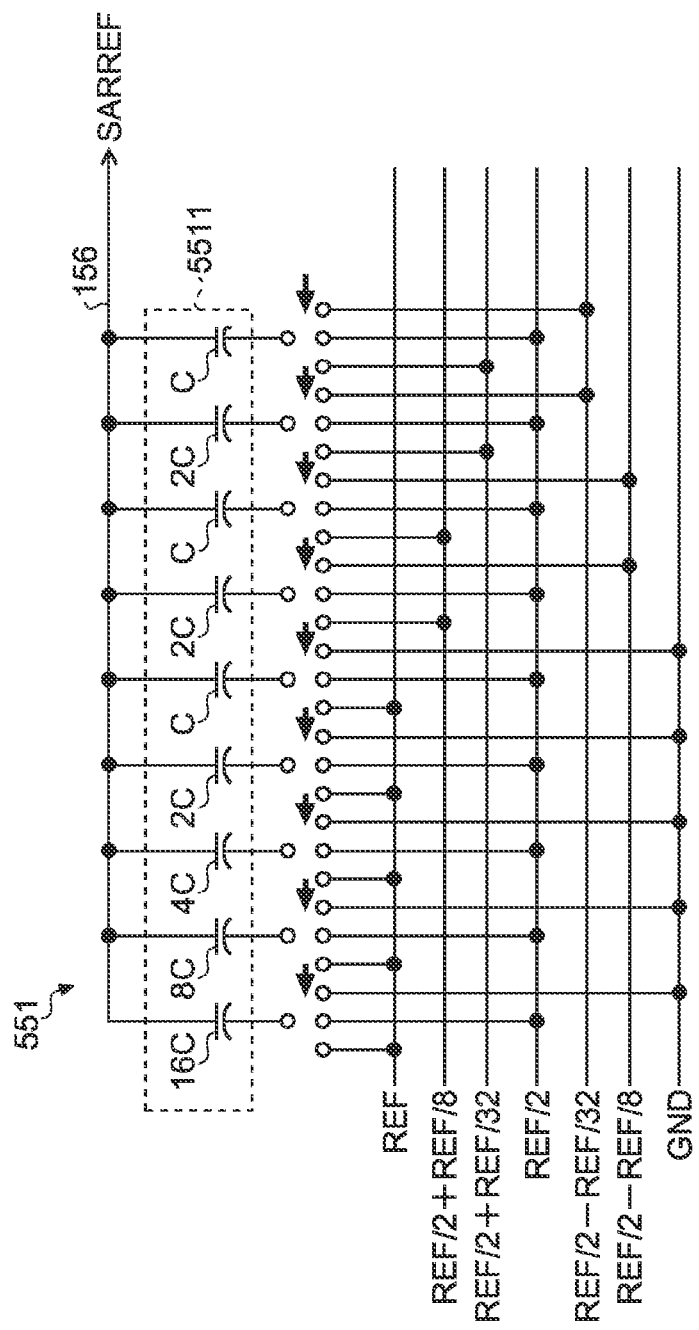
FIG. 18 is a circuit diagram illustrating a schematic configuration example of a capacitive DAC according to a second modification of the fourth embodiment.
Figure 19:
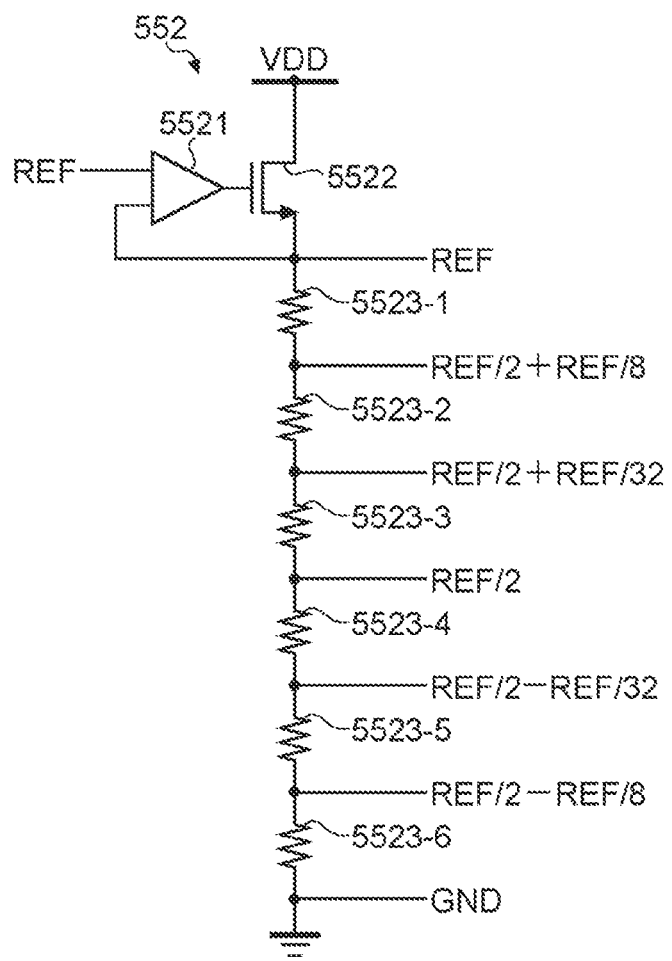
FIG. 19 is a circuit diagram illustrating an example of an intermediate reference voltage generation circuit according to the second modification of the fourth embodiment.

FIG. 18 and FIG. 19 are circuit diagrams illustrating a schematic configuration example of a capacitive DAC according to a second modification. As illustrated in FIG. 18, in a capacitive DAC 551 according to the first modification, intermediate reference voltages REF/2+REF/8, REF/2+REF/32, REF/2, REF/2−REF/32, and REF/2−REF/8 divided in finer steps are added, than in the first modification.

As described above, the intermediate reference voltage between the reference voltage REF and the ground GND is divided in finer steps, so that it is possible to increase combined patterns of capacitance and voltage levels. Furthermore, in such a case, as illustrated in FIG. 18, even though some of capacitors in a capacitor group 5511 are set to have the same capacitance as those of the other capacitors, it is possible to sufficiently secure the number of combined patterns of the capacitance and the voltage levels. With this, the effect of reducing an area is achieved.

FIG. 19 is a circuit diagram illustrating an example of an intermediate reference voltage generation circuit according to the second modification. As illustrated in FIG. 19, an intermediate reference voltage generation circuit 552 includes an NMOS transistor 2522 in which a drain is connected to the power supply voltage VDD and a source is connected to the ground GND via a plurality of resistors 5523-1 to 5523-6 connected in series, and a comparator 5521 with the output connected to a gate of an NMOS transistor 5522. The reference voltage REF is input to one input terminal of the comparator 5521. Furthermore, for example, a source potential of the NMOS transistor 5522 is input to the other input terminal of the comparator 5521.

In such a configuration, the intermediate reference voltages REF/2+REF/8, REF/2+REF/32, REF/2, REF/2−REF/32, and REF/2−REF/8 illustrated in FIG. 18 can be taken out from, for example, connection parts of the resistors 5523-1 to 5523-6 at respective stages.

As in the first and the second modifications described above, more capacitors and voltage levels input to the capacitors are provided, so that it is possible to increase the number of combined patterns of the capacitance and the voltage levels. Therefore, it is possible to implement the capacitive DACs 451 and 551 capable of outputting a SAR reference voltage SARREF with high randomness.

Note that the capacitive DACs 451 and 551 according to the aforementioned first and second modifications are merely examples, and, for example, it is also possible to use a split-type capacitive DAC or a hybrid-type capacitive DAC in which the configurations according to the aforementioned modifications are combined with the split-type capacitive DAC. Furthermore, since the other configurations, operations, and effects are the same as those of the aforementioned embodiments, a detailed description thereof will be omitted.

6. Fifth Embodiment

Next, a fifth embodiment of the present disclosure will be described in detail with reference to the drawings. In the first to the third methods according to the aforementioned first embodiment, the voltage value of the initialization voltage INT and the control pulse width of the switch are adjusted such that a node potential and/or a settling state after the initialization of the inverting and non-inverting input nodes of the comparator 152 at the timing of the control pulse termination of the switch that applies the initialization voltage INT, is randomly changed for each row and/or column. However, the fact that the node potential and/or the settling state after the initialization of the inverting and non-inverting input nodes of the comparator 152 at the timing of the control pulse termination of the switch that applies the initialization voltage INT is randomly changed for each row and/or column, can also be implemented by adjusting a pixel reset pulse and/or a current value of the reading current source unit 14, and/or an auto-zero pulse of the comparator (function similar to the function called initialization in the present embodiment) as disclosed in the first to the third embodiments in Japanese Patent Application Laid-open No. 2008-60872, for example. In other words, the first to the third embodiments in Japanese Patent Application Laid-open No. 2008-60872 are not limited to the single slope-type (or a ramp signal comparison-type) column AD conversion configuration, and can also be applied to the successive approximation register (SAR)-type column AD conversion configuration as in the present disclosure.

Note that since the configuration and operation of the solid-state imaging device according to the present embodiment is basically the same as the configuration and operation described using FIG. 1 and FIG. 2 in the first embodiment, a detailed description thereof will be omitted.

7. Sixth Embodiment

Next, a sixth embodiment of the present disclosure will be described in detail with reference to the drawings. For example, the technology disclosed in International Publication No. 2014-132822 is not limited to the single slope-type (or the ramp signal comparison-type) column AD conversion configuration, and can also be applied to the successive approximation register (SAR)-type column AD conversion configuration as in the present disclosure. That is, even in the successive approximation register (SAR)-type column AD conversion configuration, by connecting the outputs of source followers configured for each column, auto-zeroing them, and then disconnecting the outputs of the source followers again, it is possible to widen the distribution of the outputs of the source followers, so that it is possible to disperse the distribution of reset levels. In other words, by short-circuiting between the vertical signal lines VSL, it is possible to add random noise for each column to a pixel signal transmitted through the vertical signal lines VSL. As a consequence, it is possible to reduce noise in the row direction such as quantization vertical streaks and/or noise in the lateral direction such as streaking.

Note that since the configuration and operation of the solid-state imaging device according to the present embodiment is basically the same as the configuration and operation described using FIG. 1 and FIG. 2 in the first embodiment, a detailed description thereof will be omitted.

8. Application to Indirect TOF-Type Distance Image Sensor

The technology according to the present disclosure can also be applied to an indirect time of flight (TOF)-type distance image sensor in addition to the imaging element such as the aforementioned CMOS image sensor. The indirect TOF-type distance image sensor is a sensor that measures a distance to an object with light emitted from a light source and reflected on the object, by measuring the light flight time based on detection of an arrival phase difference of the reflected light.

8.1 System Configuration Example

Figure 20:
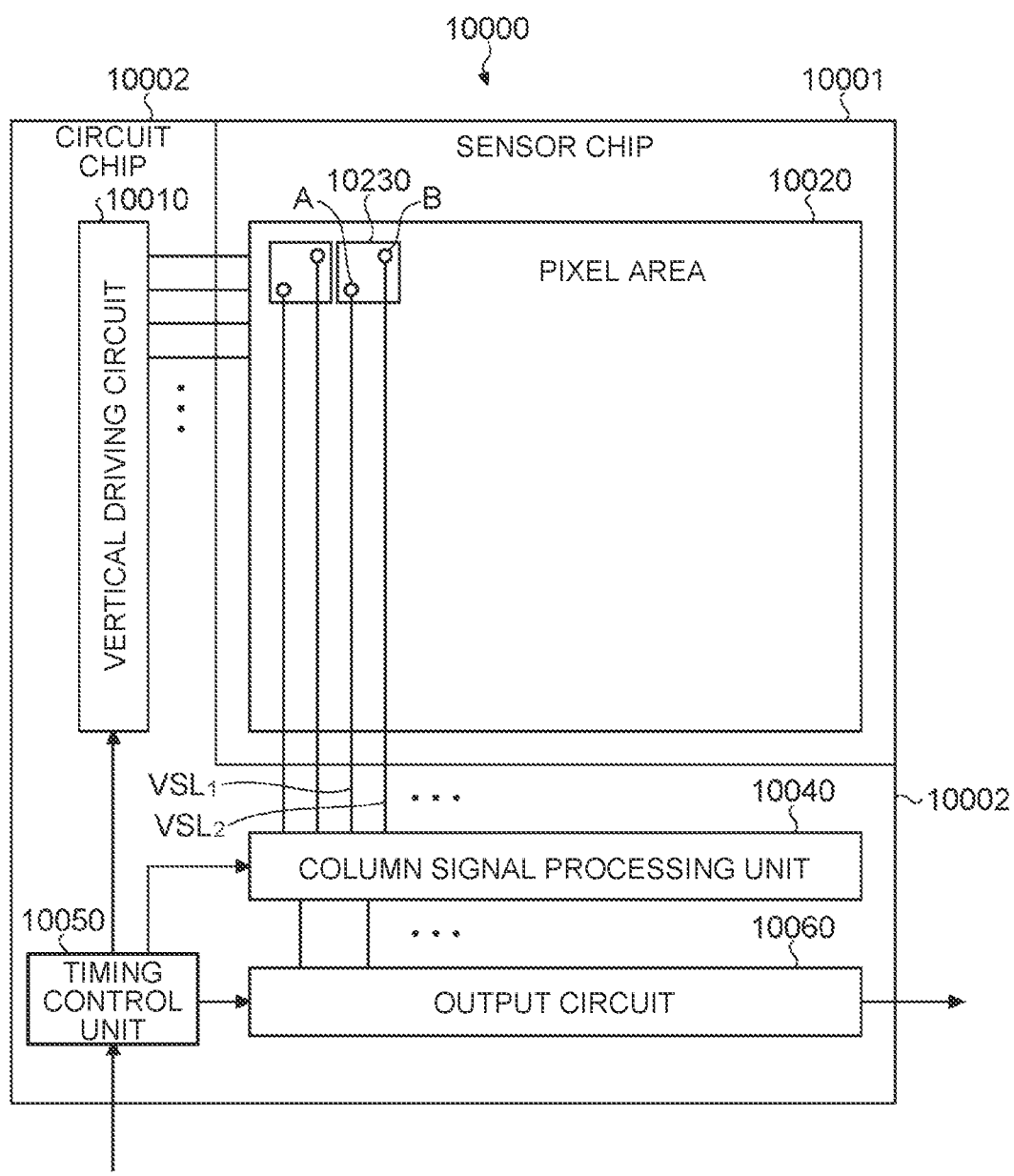
FIG. 20 is a block diagram illustrating an example of a system configuration of an indirect TOF-type distance image sensor to which a technology according to the present disclosure is applied.

FIG. 20 is a block diagram illustrating an example of a system configuration of the indirect TOF-type distance image sensor to which the technology according to the present disclosure is applied.

As illustrated in FIG. 20, an indirect TOF-type distance image sensor 10000 has a stack structure including a sensor chip 10001 and a circuit chip 10002 stacked on the sensor chip 10001. In the stack structure, the sensor chip 10001 and the circuit chip 10002 are electrically connected through a connection part (not illustrated) such as a via and a Cu—Cu connection. Note that FIG. 20 illustrates a state in which wiring of the sensor chip 10001 and wiring of the circuit chip 10002 are electrically connected via the aforementioned connection part.

A pixel array unit 10020 is formed on the sensor chip 10001. The pixel array unit 10020 includes a plurality of pixels 10230 disposed on the sensor chip 10001 in a matrix shape (array shape) in a two-dimensional grid pattern. In the pixel array unit 10020, each of the pixels 10230 receives infrared light, performs photoelectric conversion, and outputs an analog pixel signal. In the pixel array unit 10020, two vertical signal lines VSL1 and VSL2 are routed for each pixel sequence. When it is assumed that the number of pixel sequences of the pixel array unit 10020 is set to M (M is an integer), a total of 2×M vertical signal lines VSL is routed to the pixel array unit 10020.

Each of the pixels 10230 has two taps A and B (details thereof will be described later). Of the two vertical signal lines VSL1 and VSL2, the vertical signal line VSL1 outputs a pixel signal AINP1 based on the charge of the tap A of the pixel 10230 of a corresponding pixel sequence, and the vertical signal line VSL2 outputs a pixel signal AINP2 based on the charge of the tap B of the pixel 10230 of a corresponding pixel sequence. The pixel signals AINP1 and AINP2 will be described later.

On the circuit chip 10002, a vertical driving circuit 10010, a column signal processing unit 10040, an output circuit unit 10060, and a timing control unit 10050 are disposed. The vertical driving circuit 10010 drives the pixels 10230 of the pixel array unit 10020 in units of pixel rows, and allows the pixel signals AINP1 and AINP2 to be output. Under the driving of the vertical driving circuit 10010, the pixel signals AINP1 and AINP2 output from the pixels 10230 of the selected rows are supplied to the column signal processing unit 10040 through the vertical signal lines VSL1 and VSL2.

The column signal processing unit 10040 has a configuration having a plurality of ADCs (corresponding to the aforementioned column AD circuits) provided for each pixel sequence, for example, in correspondence to the pixel sequence of the pixel array unit 10020. Each ADC performs an AD conversion process on the pixel signals AINP1 and AINP2 supplied through the vertical signal lines VSL1 and VSL2, and outputs the AD-converted signals to the output circuit unit 10060. The output circuit unit 10060 performs a CDS process and the like on the digitized pixel signals AINP1 and AINP2 output from the column signal processing unit 10040, and outputs the CDS-processed signals to an exterior of the circuit chip 10002.

The timing control unit 10050 generates various timing signals, clock signals, control signals, and the like, and controls driving of the vertical driving circuit 10010, the column signal processing unit 10040, the output circuit unit 10060, and the like based on these signals.

8.2 Circuit Configuration Example of Pixel

Figure 21:
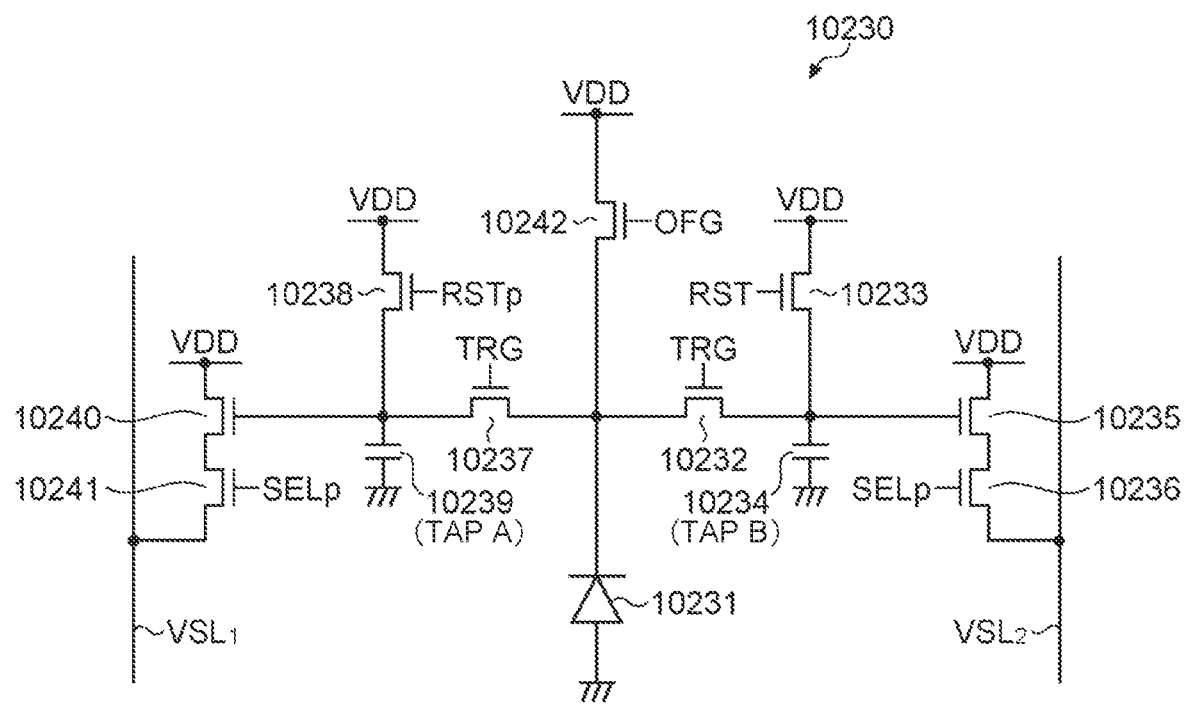
FIG. 21 is a circuit diagram illustrating an example of a circuit configuration of a pixel in the indirect TOF-type distance image sensor to which the technology according to the present disclosure is applied.

FIG. 21 is a circuit diagram illustrating an example of a circuit configuration of the pixel in the indirect TOF-type distance image sensor to which the technology according to the present disclosure is applied.

The pixel 10230 according to the present example has, for example, a photodiode 10231 as a photoelectric conversion unit. The pixel 10230 has a configuration including an overflow transistor 10242, two transfer transistors 10232 and 10237, two reset transistors 10233 and 10238, two floating diffusion layers 10234 and 10239, two amplification transistors 10235 and 10240, and two select transistors 10236 and 10241, in addition to the photodiode 10231. The two floating diffusion layers 10234 and 10239 correspond to the tabs A and B illustrated in FIG. 20.

The photodiode 10231 photoelectrically converts received light to generate an electric charge. The photodiode 10231 may have a backside irradiation-type pixel structure. The backside irradiation-type structure is as described in the pixel structure of the CMOS image sensor. However, the photodiode 10231 is not limited to the backside irradiation-type structure, and may have a surface irradiation-type structure that captures light emitted from a substrate surface side.

The overflow transistor 10242 is connected between a cathode electrode of the photodiode 10231 and a power supply line of the power supply voltage VDD, and has a function of resetting the photodiode 10231. Specifically, the overflow transistor 10242 becomes conductive in response to an overflow gate signal OFG supplied from the vertical driving circuit 10010, thereby sequentially discharging the electric charge of the photodiode 10231 to the power supply line.

The two transfer transistors 10232 and 10237 are connected between the cathode electrode of the photodiode 10231 and the respective floating diffusion layers 10234 and 10239. Furthermore, the transfer transistors 10232 and 10237 become conductive in response to a transfer signal TRG supplied from the vertical driving circuit 10010, thereby sequentially transferring the electric charges generated by the photodiode 10231 to the floating diffusion layers 10234 and 10239, respectively.

The floating diffusion layers 10234 and 10239 corresponding to the tabs A and B accumulate the electric charge transferred from the photodiode 10231, convert the electric charge into a voltage signal having a voltage value corresponding to the amount of the electric charge, and generate the pixel signals $AIN_{P1}$ and $AIN_{P2}$.

The two reset transistors 10233 and 10238 are connected between the two respective floating diffusion layers 10234 and 10239 and the power supply line of the power supply voltage VDD. Furthermore, the reset transistors 10233 and 10238 become conductive in response to a reset signal RST supplied from the vertical driving circuit 10010, thereby extracting the electric charges from the floating diffusion layers 10234 and 10239, respectively, and initializing the amount of the electric charge.

The two amplification transistors 10235 and 10240 are connected between the power supply line of the power supply voltage VDD and the two respective select transistors 10236 and 10241, thereby amplifying voltage signals charge-voltage-converted by the floating diffusion layers 10234 and 10239, respectively.

The two select transistors 10236 and 10241 are connected between the two amplification transistors 10235 and 10240 and the vertical signal lines VSL1 and VSL2, respectively. Furthermore, the select transistors 10236 and 10241 become conductive in response to a selection signal SEL supplied from the vertical driving circuit 10010, thereby outputting the voltage signals amplified respectively by the amplification transistors 10235 and 10240 to the two vertical signal lines VSL1 and VSL2 as the pixel signals $AIN_{P1}$ and $AIN_{P2}$.

The two vertical signal lines VSL1 and VSL2 are connected to an input terminal of one ADC in the column signal processing unit 10040 for each pixel sequence, and transfer the pixel signals $AIN_{P1}$ and $AIN_{P2}$ output from the pixels 10230 for each pixel sequence to the ADC.

Note that the circuit configuration of the pixel 10230 is not limited to the circuit configuration illustrated in FIG. 21 as long as it can generate the pixel signals $AIN_{P1}$ and $AIN_{P2}$ by photoelectric conversion.

In the indirect TOF-type distance image sensor 10000 having the aforementioned configuration, the technology according to the present disclosure can be applied to each ADC provided in the column signal processing unit 10040. That is, as each ADC of the column signal processing unit 10040, the successive approximation register (SAR)-type column AD circuit according to the first to sixth embodiments can be used.

While the embodiments of the present disclosure have been described, the technical scope of the present disclosure is not limited to the aforementioned each embodiment and various modifications can be made without departing from the gist of the present disclosure. Furthermore, components in different embodiments and modifications may be combined as appropriate.

Furthermore, the effects in each embodiment described in the present specification are merely examples and are not limitative, and other effects may be achieved.

Moreover, each of the aforementioned embodiments may be used alone or in combination with other embodiments.

Note that the present technology can also take the following configurations.

(1)

A solid-state imaging device comprising:

a plurality of unit pixels arranged in a row direction and a column direction;

a plurality of vertical signal lines each connected to at least one of the unit pixels arranged in the column direction;

a plurality of first converters connected to the respective vertical signal lines and converting an analog pixel signal appearing on the corresponding vertical signal line into a digital pixel signal in reading each unit pixel arranged in the row direction;

an initialization voltage generator that outputs an initialization voltage for initializing the unit pixels or input nodes of the first converters; and an initialization voltage line that connects the initialization voltage generator and the first converters, wherein the initialization voltage generator changes the initialization voltage that is output for each row and/or column to be processed by the first converters.

(2)

The solid-state imaging device according to (1), wherein each of the first converters comprises a comparator in which a first input terminal is connected to any one of the vertical signal lines via a capacitor and a second input terminal receives a voltage for comparison via a capacitor, and the initialization voltage line is connected to at least one of the first input terminal and the second input terminal.

(3)

The solid-state imaging device according to (2), further comprising:

a second converter that outputs the voltage for comparison; and wiring that connects the second converter and the second input terminal of the comparator, wherein the second converter switches a voltage value of the voltage for comparison that is output based on a comparison result output from the comparator.

(4)

The solid-state imaging device according to (3), further comprising:

a reference voltage generator that outputs a reference voltage having a constant voltage value; and a reference voltage line that connects the reference voltage generator and the second converter in the first converters, wherein the second converter generates the voltage for comparison based on the reference voltage.

(5)

The solid-state imaging device according to (2), further comprising:

a reference voltage generator that outputs a reference voltage whose voltage value changes in a ramp-like manner; and a reference voltage line that connects the reference voltage generator and the second input terminal of the comparator in the first converters via the capacitor.

(6)

The solid-state imaging device according to any one of (1) to (5), wherein the initialization voltage generator changes at least one of a voltage value of the initialization voltage and a control pulse width of a switch that applies the voltage for initializing the input nodes of the first converters, for each row and/or column to be processed by the first converters.

(7)

The solid-state imaging device according to (6), wherein the initialization voltage generator changes at least one of the voltage value of the initialization voltage and the control pulse width of the switch, which applies the voltage for initializing the input nodes of the first converters, such that a settling state of each of the input nodes of the first converters at an end timing of a period in which each of the input nodes of the first converters is initialized is changed for each row and/or column.

(8)

The solid-state imaging device according to any one of (1) to (5), further comprising:

a reading current source unit that controls a reading current flowing through each of the unit pixels, wherein a current value of the reading current is changed for each row to be processed by the first converters.

(9)

The solid-state imaging device according to (6), wherein a pulse width of a reset gate for resetting the unit pixels is changed for each of the unit pixels such that a settling state at an end timing of a period in which each of the unit pixels is initialized is changed for each row and/or column.

(10)

The solid-state imaging device according to any one of (1) to (9), wherein each of the first converters further comprises a mechanism that holds a first pixel signal obtained by digitally converting the analog pixel signal appearing on the vertical signal line after initializing the unit pixels or the input nodes of the first converters and a second pixel signal obtained by digitally converting the analog pixel signal appearing on the vertical signal line after exposing the unit pixels to light, or a logic circuit that calculates a difference between the first pixel signal obtained by digitally converting the analog pixel signal appearing on the vertical signal line and the second pixel signal obtained by digitally converting the analog pixel signal appearing on the vertical signal line after exposing the unit pixels to light.

(11)

A solid-state imaging device comprising:

a plurality of unit pixels arranged in a row direction and a column direction;

a plurality of vertical signal lines each connected to at least one of the unit pixels arranged in the column direction; and a plurality of first converters connected to the respective vertical signal lines and converting an analog pixel signal appearing on the corresponding vertical signal line into a digital pixel signal in reading each unit pixel arranged in the row direction, wherein each of the first converters comprises:

a second converter that outputs a voltage for comparison; and a comparator in which a first input terminal is connected to any one of the vertical signal lines via a capacitor and a second input terminal is connected to the second converter, and the comparator changes a constant of a transistor that constitutes the second input terminal for each row and/or column to be processed by the first converters.

(12)

The solid-state imaging device according to (11), wherein the comparator changes the constant of the transistor, which constitutes the second input terminal, by changing number of fingers and/or multiple fingers of the transistor, which constitutes the second input terminal, for each row and/or column to be processed by the first converters.

(13). The solid-state imaging device according to (11), wherein the comparator includes a plurality of transistors constituting the second input terminal, the transistors have constants different from each other, and the comparator changes the constants of the transistors constituting the second input terminal by selectively using one or more of the transistors for each row and/or column to be processed by the first converters.

(14)

The solid-state imaging device according to any one of (10) to (13), wherein each of the first converters further comprises a mechanism that holds a first pixel signal obtained by digitally converting the analog pixel signal appearing on the vertical signal line after initializing the unit pixels or input nodes of the first converters and a second pixel signal obtained by digitally converting the analog pixel signal appearing on the vertical signal line after exposing the unit pixels to light, or a logic circuit that calculates a difference between the first pixel signal obtained by digitally converting the analog pixel signal appearing on the vertical signal line and the second pixel signal obtained by digitally converting the analog pixel signal appearing on the vertical signal line after exposing the unit pixels to light.

(15)

A solid-state imaging device comprising:
 a plurality of unit pixels arranged in a row direction and a column direction;
 a plurality of vertical signal lines each connected to at least one of the unit pixels arranged in the column direction; and
 a plurality of first converters connected to the respective vertical signal lines and converting an analog pixel signal appearing on the corresponding vertical signal line into a digital pixel signal in reading each unit pixel arranged in the row direction, wherein
  each of the first converters comprises:
   a second converter that outputs a voltage for comparison; and
   a comparator in which a first input terminal is connected to any one of the vertical signal lines via a capacitor and a second input terminal is connected to the second converter, and
  the second converter changes a reset code for the comparison to be output, for each row and/or column to be processed by the first converters.

(16)

The solid-state imaging device according to (15), wherein the second converter includes a plurality of capacitors connected in parallel, and changes the reset code for the comparison to be output, by switching a connection destination of one end of each of the capacitors for each row and/or column to be processed by the first converters.

(17)

The solid-state imaging device according to (16), wherein the second converter includes a circuit that generates a plurality of intermediate reference voltages having different voltage values from a predetermined reference voltage, and changes a voltage value of the voltage for comparison to be output, by switching a voltage to be applied to one end of each of the capacitors, to any one of the reference voltage, the intermediate reference voltages, and a ground voltage for each row and/or column to be processed by the first converters.

(18)

The solid-state imaging device according to (17), further comprising:
 a reference voltage generator that outputs a reference voltage having a constant voltage value; and
 a reference voltage line that connects the reference voltage generator and the second converter in the first converters.

(19)

The solid-state imaging device according to any one of (15) to (18), wherein each of the first converters further comprises a mechanism that holds a first pixel signal obtained by digitally converting the analog pixel signal appearing on the vertical signal line after initializing the unit pixels or input nodes of the first converters and a second pixel signal obtained by digitally converting the analog pixel signal appearing on the vertical signal line after exposing the unit pixels to light, or a logic circuit that calculates a difference between the first pixel signal obtained by digitally converting the analog pixel signal appearing on the vertical signal line and the second pixel signal obtained by digitally converting the analog pixel signal appearing on the vertical signal line after exposing the unit pixels to light.

REFERENCE SIGNS LIST 10 solid-state imaging device
11 timing control unit
12 vertical scanning circuit
13, 23 pixel array unit
13A to 13Z, 23A to 23Z pixel group
13a to 13d group
131 unit pixel
14 reading current source unit
141 variable current source unit
15, 25 column processing unit
15A to 15Z, 25A to 25Z column AD circuit
16 noise addition unit
17 reference voltage generator
27 dac
18 horizontal scanning circuit
19 output unit
151, 451, 551 capacitive DAC
152 comparator
153a, 153b switch
154 logic circuit
156, 158 wiring
157 control line
161, 162, 163, 164 initialization voltage generator
1621 PMOS transistor
1631 nMOS transistor
1632-1 to 1632-$k$ resistor
1633 amplifier
351 offset
1511, 4511, 5511 CAPACITOR GROUP
1521, 1523 PMOS transistor
1522, 1524 resistor
1525 variable current source
552 intermediate reference voltage generation circuit
5521 comparator
5522 NMOS transistor
5523-1 to 5523-6 resistor
10000 indirect TOF-type distance image sensor
10001 sensor chip
10002 circuit chip
10010 vertical driving circuit
10020 pixel array unit
10040 column signal processing unit
10050 timing control unit
10060 output circuit unit
10230 pixel
10231 photodiode
10232, 10237 transfer transistor
10233, 10238 reset transistor
10234 floating diffusion layer (taP a)
10235, 10240 amplification transistor
10236, 10241 select transistor
10239 floating diffusion layer (taP b)
10242 overflow transistor
int initialization voltage (line)
ref reference voltage (line)
p1 to p3 pixel signal
hsl horizontal signal line
rcl row control line
vsl, vsl1 to vsl8, $VSL_1$, $VSL_2$ vertical signal line

The invention claimed is:

1. A solid-state imaging device comprising:
   a plurality of unit pixels arranged in a row direction and a column direction;
   a plurality of vertical signal lines each connected to at least one of the unit pixels arranged in the column direction;
   a plurality of first converters connected to the respective vertical signal lines and converting an analog pixel signal appearing on the corresponding vertical signal line into a digital pixel signal in reading each unit pixel arranged in the row direction;
   an initialization voltage generator that outputs an initialization voltage for initializing the unit pixels or input nodes of the first converters; and
   an initialization voltage line that connects the initialization voltage generator and the first converters, wherein
   the initialization voltage generator changes the initialization voltage that is output for each row and/or column to be processed by the first converters, and
   the initialization voltage generator changes at least one of a voltage value of the initialization voltage and a control pulse width of a switch that applies the voltage for initializing the input nodes of the first converters, for each row and/or column to be processed by the first converters.

2. The solid-state imaging device according to claim 1, wherein
   each of the first converters comprises a comparator in which a first input terminal is connected to any one of the vertical signal lines via a capacitor and a second input terminal receives a voltage for comparison via a capacitor, and
   the initialization voltage line is connected to at least one of the first input terminal and the second input terminal.

3. The solid-state imaging device according to claim 2, further comprising:
   a second converter that outputs the voltage for comparison; and
   wiring that connects the second converter and the second input terminal of the comparator, wherein
   the second converter switches a voltage value of the voltage for comparison that is output based on a comparison result output from the comparator.

4. The solid-state imaging device according to claim 3, further comprising:
   a reference voltage generator that outputs a reference voltage having a constant voltage value; and
   a reference voltage line that connects the reference voltage generator and the second converter in the first converters, wherein
   the second converter generates the voltage for comparison based on the reference voltage.

5. The solid-state imaging device according to claim 2, further comprising:
   a reference voltage generator that outputs a reference voltage whose voltage value changes in a ramp-like manner; and
   a reference voltage line that connects the reference voltage generator and the second input terminal of the comparator in the first converters via the capacitor.

6. The solid-state imaging device according to claim 1, wherein the initialization voltage generator changes at least one of the voltage value of the initialization voltage and the control pulse width of the switch, which applies the voltage for initializing the input nodes of the first converters, such that a settling state of each of the input nodes of the first converters at an end timing of a period in which each of the input nodes of the first converters is initialized is changed for each row and/or column.

7. The solid-state imaging device according to claim 1, further comprising:
   a reading current source unit that controls a reading current flowing through each of the unit pixels, wherein
   a current value of the reading current is changed for each row to be processed by the first converters.

8. The solid-state imaging device according to claim 1, wherein a pulse width of a reset gate for resetting the unit pixels is changed for each of the unit pixels such that a settling state at an end timing of a period in which each of the unit pixels is initialized is changed for each row and/or column.

9. The solid-state imaging device according to claim 1, wherein each of the first converters further comprises a mechanism that holds a first pixel signal obtained by digitally converting the analog pixel signal appearing on the vertical signal line after initializing the unit pixels or the input nodes of the first converters and a second pixel signal obtained by digitally converting the analog pixel signal appearing on the vertical signal line after exposing the unit pixels to light, or a logic circuit that calculates a difference between the first pixel signal obtained by digitally converting the analog pixel signal appearing on the vertical signal line and the second pixel signal obtained by digitally converting the analog pixel signal appearing on the vertical signal line after exposing the unit pixels to light.

* * * * *